(12) United States Patent
Hudgens et al.

(10) Patent No.: US 11,850,745 B2
(45) Date of Patent: Dec. 26, 2023

(54) MULTI-TURN DRIVE ASSEMBLY AND SYSTEMS AND METHODS OF USE THEREOF

(71) Applicant: APPLIED MATERIALS, INC., Santa Clara, CA (US)

(72) Inventors: Jeff Hudgens, San Francisco, CA (US); Damon K. Cox, Jarrell, TX (US); Rajkumar Thanu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/886,709

(22) Filed: Aug. 12, 2022

(65) Prior Publication Data

US 2022/0388158 A1 Dec. 8, 2022

Related U.S. Application Data

(63) Continuation of application No. 16/808,015, filed on Mar. 3, 2020, now Pat. No. 11,413,744.

(51) Int. Cl.
| | |
|---|---|
| *B25J 9/10* | (2006.01) |
| *B25J 18/00* | (2006.01) |
| *B25J 17/02* | (2006.01) |
| *H01L 21/677* | (2006.01) |
| *H01L 21/687* | (2006.01) |
| *F16H 35/02* | (2006.01) |
| *F16H 35/00* | (2006.01) |

(52) U.S. Cl.
CPC .......... *B25J 9/1045* (2013.01); *B25J 17/0241* (2013.01); *B25J 18/00* (2013.01); *F16H 35/02* (2013.01); *H01L 21/67742* (2013.01); *H01L 21/68707* (2013.01); *F16H 2035/003* (2013.01)

(58) Field of Classification Search
CPC ...... B25J 9/1045; B25J 17/0241; B25J 18/00; F16H 35/02; F16H 2035/003; H01L 21/67742; H01L 21/68707
See application file for complete search history.

(56) References Cited

U.S. PATENT DOCUMENTS

| | | | |
|---|---|---|---|
| 2,588,642 A | 3/1952 | Malsbary et al. | |
| 4,865,577 A * | 9/1989 | Freudenstein | ........... B62M 9/08 29/893.1 |
| 5,280,983 A | 1/1994 | Maydan et al. | |
| 5,789,878 A | 8/1998 | Kroeker et al. | |

(Continued)

FOREIGN PATENT DOCUMENTS

| | | |
|---|---|---|
| EP | 0922884 A2 | 6/1999 |
| JP | 4473075 B2 | 6/2010 |
| JP | 4816521 B2 | 11/2011 |

*Primary Examiner* — Saul Rodriguez
*Assistant Examiner* — Brendan P Tighe
(74) *Attorney, Agent, or Firm* — Lowenstein Sandler LLP

(57) ABSTRACT

Disclosed herein are multi-turn drive assemblies, systems and methods of use thereof. The multi-turn drive assemblies enable a robot link member to have a maximum rotation of at least 360 degrees about an axis. The multi-turn drive assemblies can be incorporated into a robot arm for enabling 360 degrees rotation of one or more link members about an axis. The robot arm may be located in a transfer chamber of an electronic device processing system. Also disclosed are methods of controlling the multi-turn drive assemblies and related robots.

20 Claims, 11 Drawing Sheets

(56) References Cited

U.S. PATENT DOCUMENTS

| | | | |
|---|---|---|---|
| 5,789,890 A | | 8/1998 | Genov et al. |
| 6,037,733 A | | 3/2000 | Genov et al. |
| 6,326,755 B1 | * | 12/2001 | Babbs ............... H01L 21/67766 |
| | | | 901/45 |
| 6,400,115 B1 | | 6/2002 | Yamazoe |
| 6,428,266 B1 | | 8/2002 | Solomon et al. |
| 6,593,718 B1 | | 7/2003 | Yamazoe |
| 6,634,851 B1 | * | 10/2003 | Bonora ............. H01L 21/68707 |
| | | | 414/744.3 |
| 6,960,057 B1 | | 11/2005 | Tofmeister |
| 7,422,406 B2 | | 9/2008 | van der Meulen |
| 8,016,542 B2 | | 9/2011 | Cox et al. |
| 8,220,354 B2 | | 7/2012 | Todorov |
| 8,701,519 B2 | | 4/2014 | Todorov |
| 8,777,547 B2 | * | 7/2014 | Kremerman ......... B65G 47/904 |
| | | | 414/217 |
| 8,833,198 B2 | | 9/2014 | Todorov |
| 9,064,919 B2 | | 6/2015 | Yazawa et al. |
| 9,248,568 B2 | | 2/2016 | Caveney et al. |
| 9,746,057 B2 | * | 8/2017 | Mu ................... G02F 1/133528 |
| 10,053,756 B2 | | 8/2018 | Jakobi et al. |
| 10,155,309 B1 | | 12/2018 | Blank |
| 10,175,035 B2 | | 1/2019 | Jordil |
| 2015/0128749 A1 | * | 5/2015 | Gilchrist ................. B25J 9/042 |
| | | | 74/490.04 |
| 2016/0263742 A1 | | 9/2016 | Hosek et al. |
| 2017/0368680 A1 | | 12/2017 | Muthukamatchi et al. |
| 2021/0183675 A1 | * | 6/2021 | Krupyshev ....... H01L 21/67754 |
| 2021/0229934 A1 | | 7/2021 | Babbs et al. |

* cited by examiner

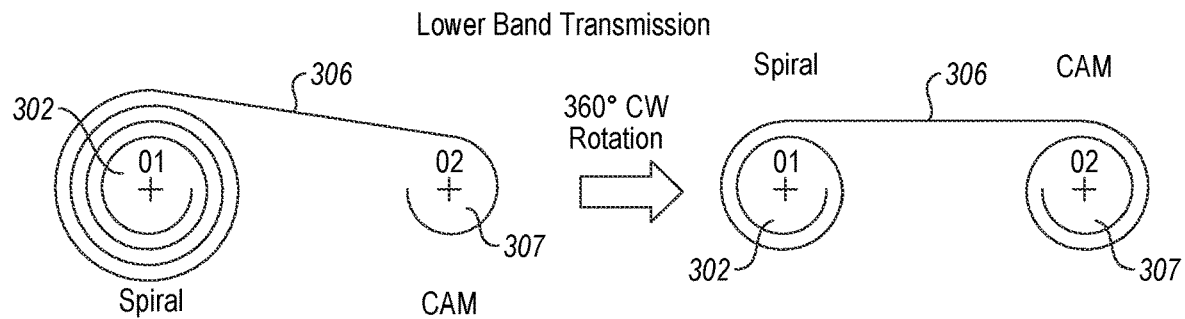
Lower Band Transmission
FIG. 3A  FIG. 3B
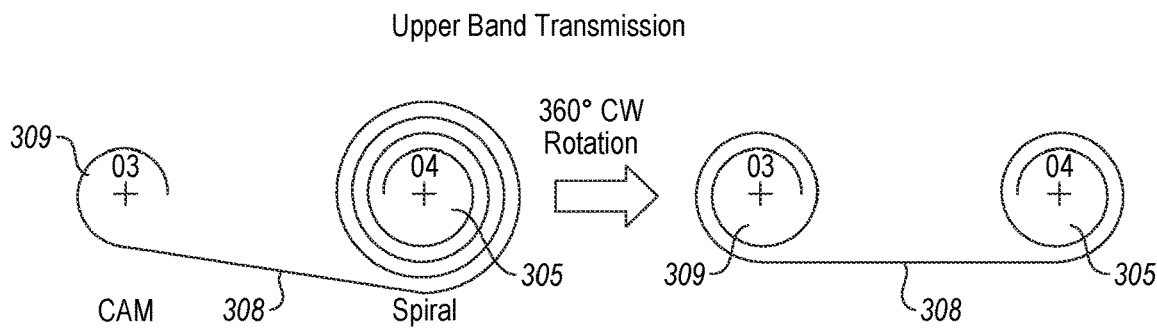
Upper Band Transmission
FIG. 3C  FIG. 3D
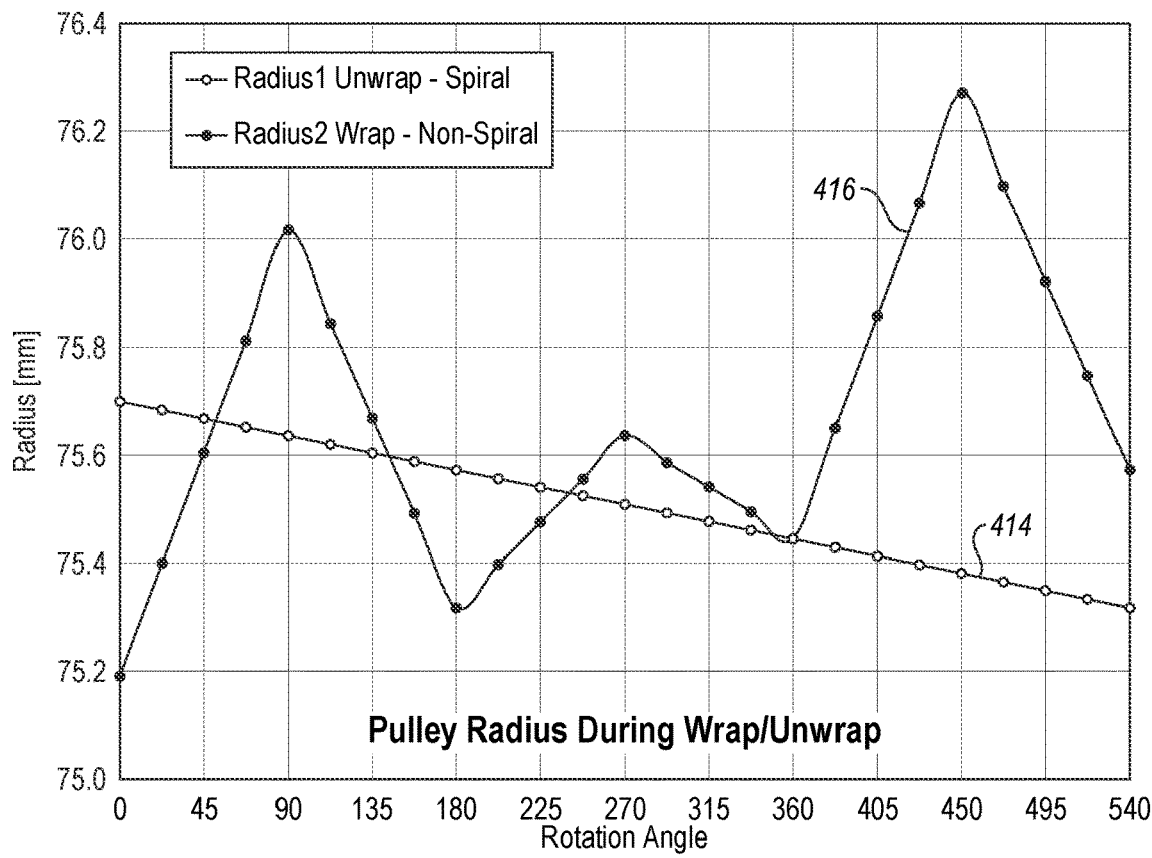
Pulley Radius During Wrap/Unwrap
FIG. 4

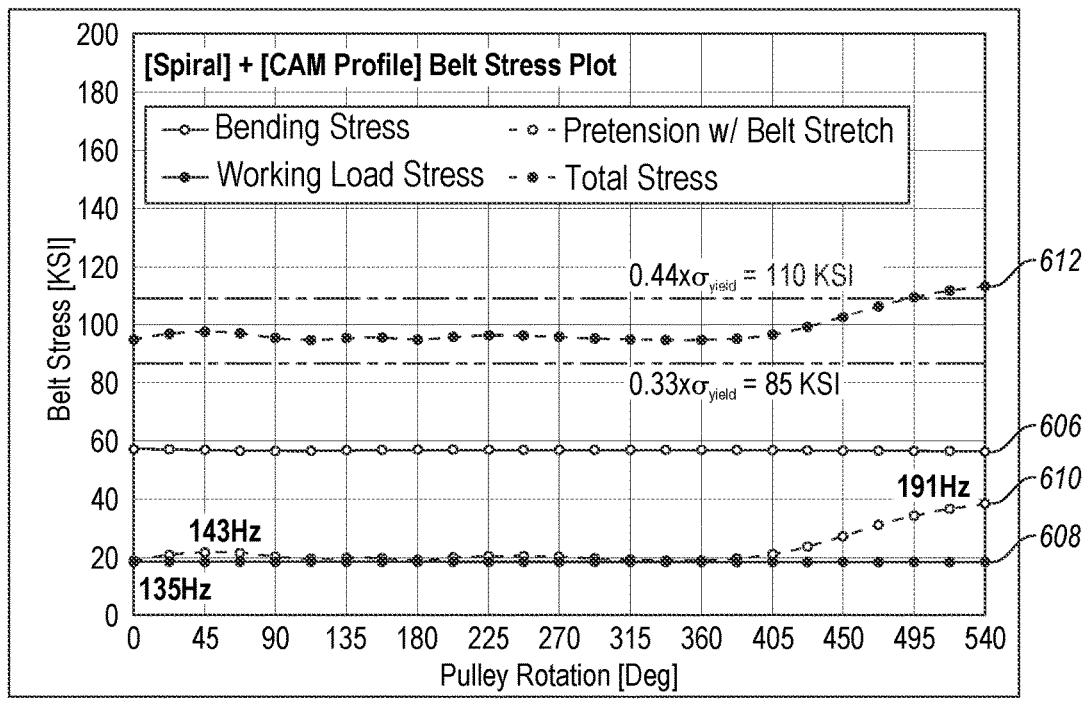
FIG. 6C
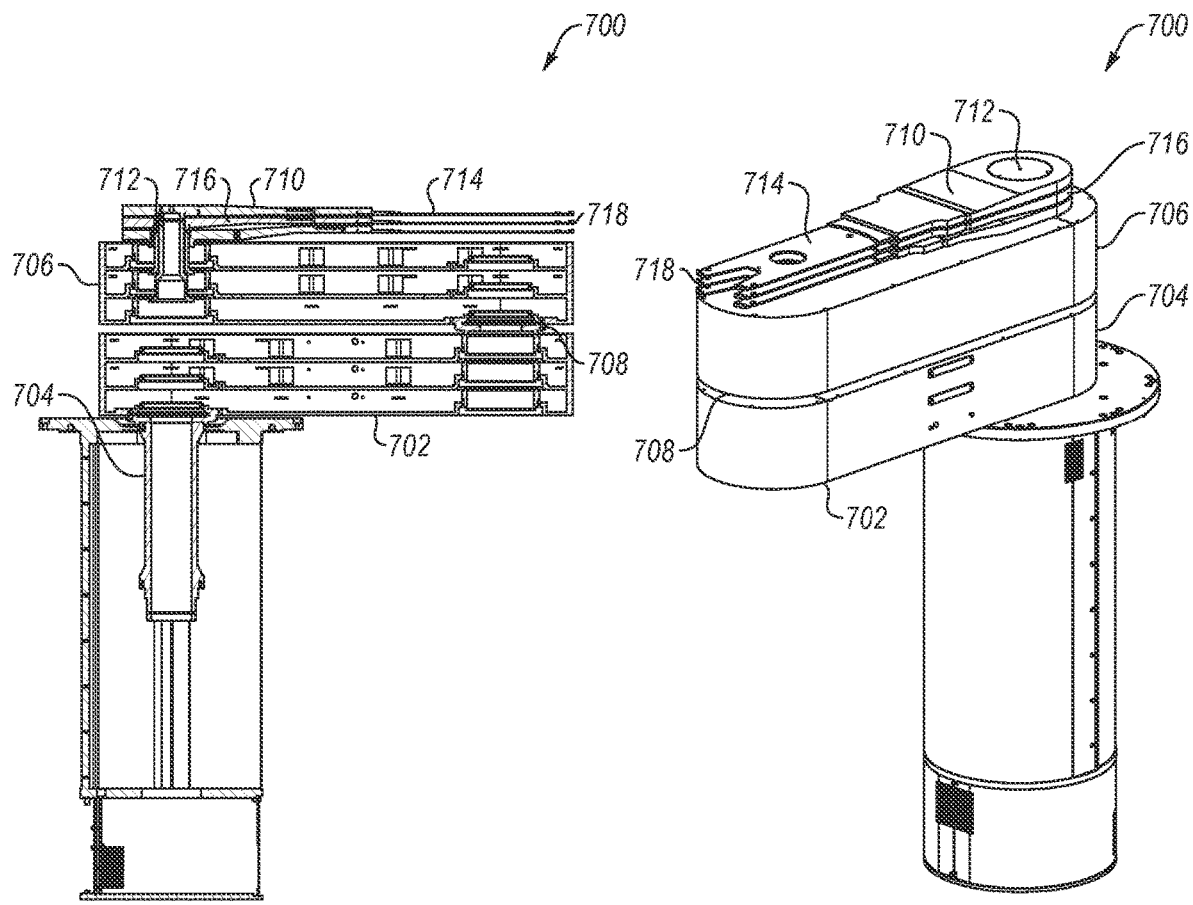
FIG. 7A
FIG. 7B

MULTI-TURN DRIVE ASSEMBLY AND SYSTEMS AND METHODS OF USE THEREOF

RELATED APPLICATIONS

The present application is a continuation of U.S. patent application Ser. No. 16/808,015, filed Mar. 3, 2020, which is incorporated by reference herein.

FIELD

The disclosure relates generally to the field of robotics and substrate transfer systems, for example, robots utilizing at least one multi-turn drive assembly for transporting substrates between electronic device processing chambers. The multi-turn drive assembly provides a link member with a maximum rotation of at least 360 degrees about an axis (e.g., a maximum rotation of 720 degrees or more about the axis). Also disclosed herein are systems and methods of use of such multi-turn drive assemblies and associated robots.

BACKGROUND

Electronic device manufacturing systems typically include process tools having multiple process chambers and one or more load-lock chambers, which may be connected to a transfer chamber. Such process chambers may be used to carry out any number of processes on substrates (e.g., silicon-containing wafers, both patterned and unpatterned, masked wafers, glass plates, silica-containing articles, and so forth) such as deposition, oxidation, nitration, etching, polishing, cleaning, lithography, metrology, and so forth.

The process chambers may be distributed about the transfer chamber. A multi-arm robot can be housed within the transfer chamber and configured to transport substrates between the various chambers. For example, transfers may be between process chambers, or between process chambers and the one or more load lock chambers. Slit valves may be located at the entries into each respective chamber.

Conventional drive assemblies for robot arm mechanisms are unable to provide full (i.e., 360 degree) rotation of a link member of a robot arm about an axis. In particular, current vacuum robots using metal belts restrict joint rotation limits typically to)±140° (280° to ±160° (320°) angular span. Such restriction is because the metal belt wraps around each pulley only once and the pulley system is configured to prevent the belt from wrapping over itself. As such, when transferring wafers between chambers, the link members and attached end effectors, possibly having a substrate disposed thereon, may pass over other link members and attached end effectors holding other substrates. Any loose particulate matter on the top substrate and/or end effector may fall and drop onto the bottom substrate ultimately resulting in substrate defects. Such drive assemblies with less than full rotation also limit the flexibility of the robot arm when making transfers.

BRIEF SUMMARY

According to various embodiments, disclosed herein is a robot, comprising an arm rotatable about a shoulder axis; a forearm rotatable relative to the arm about a forearm axis at a position offset from the shoulder axis, wherein the forearm has a maximum rotation of at least 360 degrees about the forearm axis; and a forearm drive assembly for rotating the forearm about the forearm axis, the forearm drive assembly comprising: a forearm driving member; a forearm driven member attached to the forearm; a forearm transmission element comprising: a first band, wherein a first end of the first band is affixed to the forearm driving member and a second end of the first band is affixed to the forearm driven member, and wherein the first band wraps at least two times around the forearm driving member when the forearm is in a first forearm position; and a second band, wherein a first end of the second band is affixed to the forearm driving member and a second end of the second band is affixed to the forearm driven member, wherein the second band wraps at least two times around the forearm driven member when the forearm is in the first position, wherein the first band is wrapped around the forearm driving member in a first direction and the second band is wrapped around the forearm driving member in an opposite second direction.

In further embodiments, disclosed herein is a robot, comprising an arm rotatable about a shoulder axis; a forearm rotatable relative to the arm about a forearm axis at a position offset from the shoulder axis; a first wrist member rotatable relative to the forearm about a wrist axis at a position offset from the shoulder axis, wherein the first wrist member has a maximum rotation of at least 360 degrees about the wrist axis; and a first wrist drive assembly for rotating the first wrist member about the wrist axis, the first wrist drive assembly comprising: a first wrist driving member; a first wrist driven member attached to the forearm; and a first wrist transmission element, comprising: a first band, wherein a first end of the first band is affixed to the first wrist driving member and a second end of the first band is affixed to the first wrist driven member, and wherein the first band wraps at least two times around the first wrist driving member when the first wrist member is in a first wrist position; and a second band, wherein a first end of the second band is affixed to the first wrist driving member and a second end of the second band is affixed to the first wrist driven member, wherein the second band wraps at least two times around the first wrist driven member when the first wrist member is in the first position, wherein the first band is wrapped around the first wrist driving member in a first direction and the second band is wrapped around the first wrist driving member in an opposite second direction.

In further embodiments, disclosed herein is a drive assembly for a robot, comprising: a driving member; a driven member attached to an arm link; and a transmission element, comprising: a first band, wherein a first end of the first band is affixed to the driving member and a second end of the first band is affixed to the driven member, and wherein the first band wraps at least two times around the driving member while the arm link is in a first position; and a second band, wherein a first end of the second band is affixed to the driving member and a second end of the second band is affixed to the driven member, wherein the second band wraps at least two times around the driven member when the arm link is in the first position, and wherein the first band is wrapped around the driving member in a first direction and the second band is wrapped around the driving member in an opposite second direction, wherein the arm link is rotatable about an axis of the driven member and has a maximum rotation of at least 360 degrees about the axis.

BRIEF DESCRIPTION OF THE DRAWINGS

The present disclosure is illustrated by way of example, and not by way of limitation, in the figures of the accompanying drawings in which like references indicate similar elements.

FIG. 3A shows a transmission diagram of a spiral-cam pulley system of a multi-turn drive assembly according to embodiments.

FIG. 3B shows a transmission diagram of a spiral-cam pulley system of a multi-turn drive assembly according to embodiments.

FIG. 3C shows a transmission diagram of a spiral-cam pulley system of a multi-turn drive assembly according to embodiments.

FIG. 3D shows a transmission diagram of a spiral-cam pulley system of a multi-turn drive assembly according to embodiments.

FIG. 4 depicts a chart showing the change in radius with rotation angle of a cam pulley for use in a multi-turn drive assembly according to embodiments.

FIG. 6C depicts the belt stress profile of a spiral-cam pulley assembly of a multi-turn drive assembly according to embodiments.

FIG. 7A depicts a robot arm having at least one multi-turn drive assembly according to various embodiments.

FIG. 7B depicts a robot arm having at least one multi-turn drive assembly according to various embodiments.

DETAILED DESCRIPTION

Figure 1A:
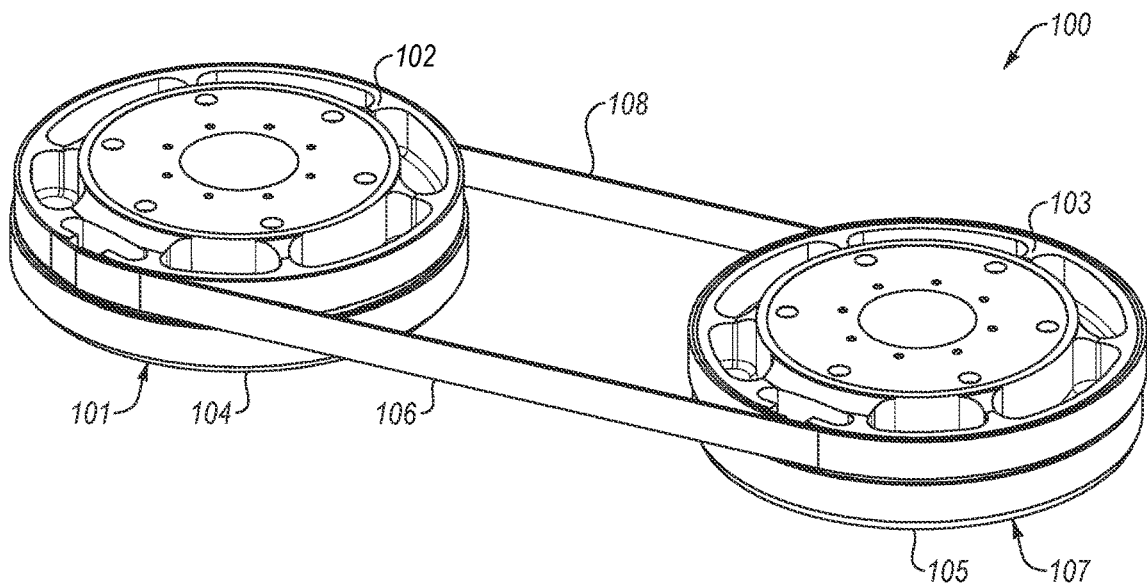
FIG. 1A depicts a perspective view of a multi-turn drive assembly according to various embodiments.

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a robot arm" includes a single robot arm as well as more than one robot arm.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The terms "belt" and "band" are used interchangeably herein and refer to a portion of a transmission element for a multi-turn drive assembly according to embodiments.

According to embodiments, disclosed herein are multi-turn drive assemblies for robots, each drive assembly having a driving member, a driven member attached to an arm link and a transmission element. The multi-turn drive assemblies provide 360° or more joint rotation (e.g., which may include 720° or more of joint rotation), which allows flexibility in wafer swap moves and throughput advantages for robot assemblies. An example of a type of robot arm that can benefit from embodiments of the present disclosure is a selective compliance assembly robot arm (SCARA) robot. Embodiments described herein may be used with vacuum robots (e.g., SCARA vacuum robots) that are included in, for example, transfer chambers as well as atmospheric robots (e.g., SCARA atmospheric robots) that are included in, for example, factory interfaces. The transmission element can include a first band, wherein a first end of the first band is affixed to the driving member and a second end of the first band is affixed to the driven member. According to embodiments, the first band wraps at least two times around the driving member when the arm link is in a first position. In other embodiments, the first band wraps at least 1.1 times, 1.2 times, 1.3 times, 1.4 times, 1.5 times, 1.6 times, 1.7 times, 1.8 times or 1.9 times around the driving member when the arm link is in the first position. The transmission element can further include a second band, wherein a first end of the second band is affixed to the driving member and a second end of the second band is affixed to the driven member. In embodiments, the second band wraps at least two times around the driven member when the arm link is in the first position. In other embodiments, the second band wraps at least 1.1 times, 1.2 times, 1.3 times, 1.4 times, 1.5 times, 1.6 times, 1.7 times, 1.8 times or 1.9 times around the driven member when the arm link is in the first position. According to embodiments, the first band is wrapped around the driving member in a first direction and the second band is wrapped around the driving member in an opposite second direction. According to embodiments, the arm link is rotatable about an axis of the driven member and has a maximum rotation of at least 360 degrees about the axis. The maximum rotation of at least 360 degrees means that the arm link can rotate anywhere from 0 degrees to 360 degrees and even greater 360 degrees (e.g., 720 degrees), that is, the arm link can rotate multiple times about the axis of rotation. For example, an arm link may have a maximum rotation of at least 360 degrees, at least 380 degrees, at least 400 degrees, at least 450 degrees, at least 540 degrees, at least 720 degrees, or some other amount.

Multi-turn drive assemblies as described herein enable metal belt robot transmission elements to rotate more than the typical ±140 to ±160 degrees. The multi-turn drive assemblies enable a full 360+ degree (including multiples of 360 degrees in some embodiments) motion of the robot joints. According to embodiments, these drive assemblies enable substrate transfers in an elongated rectangular transfer chamber with chambers mounted on all four sides. The multi-turn drive assemblies can include bands having multiple wraps around drive members while maintaining 1) prescribed band tensions; and 2) angular phasing of the driving and driven pulley members. Conventional belt transmission assemblies do not wrap bands on top of each other and are limited to less than 360 degree relative rotation. In a traditional band transmission, the band is strapped around each pulley and is then pre-tensioned because it is anchored to the pulleys. The pulleys cannot rotate beyond 360 degrees; thus, the radius of the band around the pulleys is constant. Robots operating with multi-turn drive assemblies as described herein can adequately transfer substrates between process chambers linked by an elongated, high aspect ratio, linear mainframe transfer chamber and related platform architectures. The multi-turn drive assemblies allow a robot to reach all possible chamber locations around the platform and efficient planning of robot paths and trajectories improves throughput while simultaneously avoiding wafer-over-wafer and/or arm-over-wafer positions.

The multi-turn drive assemblies described herein provide improved substrate transfer systems that perform efficient and precise transport of substrates between chambers while simultaneously avoiding wafer-over-wafer and/or arm-over-wafer arrangements. Avoiding these positions is desirable so that any loose particles or metals remaining on a substrate, end effector and/or wrist member after a process step do not fall onto a substrate underneath, which can result in substrate defects. Furthermore, the ability of the drive assemblies to rotate 0 degrees to 360 degrees or more, enables robot arms, for example, to move in more complex ways to provide fast substrate swaps and/or simultaneous loading of substrates into different chambers. These configurations thus improve system throughput.

As shown in FIG. 1A, according to embodiments, a multi-turn drive assembly 100 can include a driving member 101 as well as a driven member 107. Both the driving member 101 and the driven member 107 can be or include one or more cylinders or pulleys about which a first belt 106 and a second belt 108 wrap. In embodiments, the driving member 101 includes a first pulley 102 and a second pulley 104, and the driven member 107 includes a third pulley 103 and a fourth pulley 105. The first belt 106 is affixed to first pulley 102 and third pulley 103 in an embodiment. The second belt 108 is affixed to second pulley 104 and fourth pulley 105 in an embodiment. The driving and driven members 101, 107 and the bands 106, 108 form a pulley system. According to embodiments, a first end of band 106 is affixed to driving member 101 (e.g., to first pulley 102) and a second end of band 106 is attached to the driven member 107 (e.g., to third pulley 103). Similarly, a first end of band 108 is affixed to driving member 101 (e.g., to second pulley 104) and a second end of band 108 is attached to the driven member 107 (e.g., to fourth pulley 105).

First pulley 102 and second pulley 104 have a common axis of rotation. Similarly, pulley 103 and pulley 105 have a common axis of rotation. As will be discussed in more detail with respect to FIGS. 2A-2E, pulleys 102 and 104 may be attached together and/or to driving member 101 with a fixed relationship. In some embodiments, pulleys 102 and 104 are formed from a single body and/or on the same structure. In other embodiments, pulleys 102 and 104 are formed from separate bodies that are coupled together. Pulleys 103 and 105 may be attached together and/or formed from a single body and have a fixed rotational relationship. Alternatively, pulleys 103 and 105 may be attached together via a torsion spring. Accordingly, the pulleys 103 and 105 may have a non-fixed rotational relationship (i.e., where the two pulleys can rotate different amounts relative to one another). In some embodiments, pulleys 103 and 105 are formed from a single body and/or on the same structure. In other embodiments, pulleys 103 and 105 are formed from separate bodies that are coupled together. Band 106 may be disposed at a first location on driving member 101 and band 106 may be disposed at a first location on driven member 107. Similarly, band 108 may be disposed at a second location (e.g., below band 106) on driving member 101 and band 108 may be disposed at a second location (e.g., below band 106) on driven member 107.

Figure 1B:
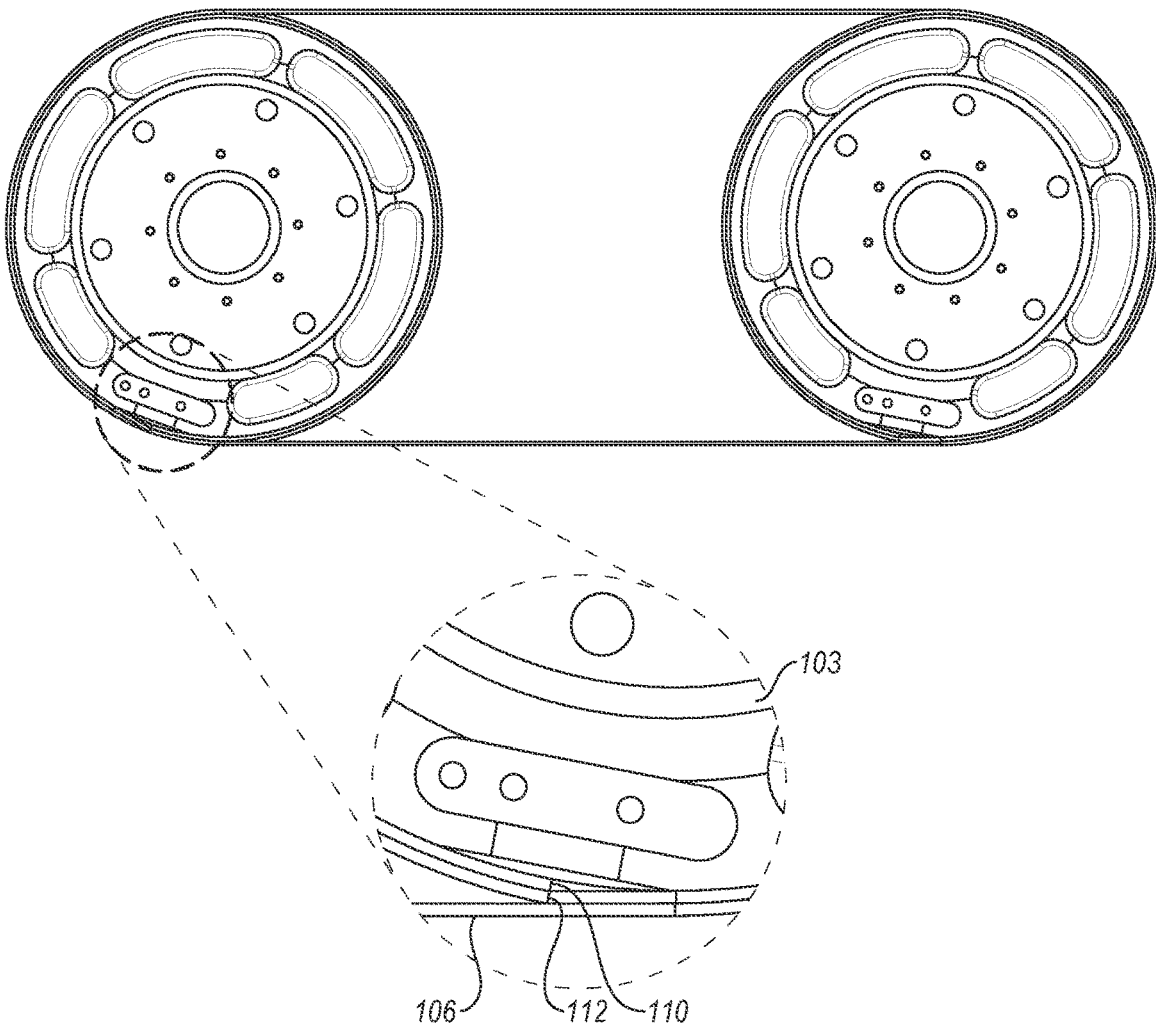
FIG. 1B depicts a blow-up of a pulley of a multi-turn drive assembly according to various embodiments.

As shown in FIG. 1B, a first end 110 of band 106 can be attached to pulley 103, for example, via a tensioner element 110 (not shown) as will be described in more detail with respect to FIGS. 8A-8D. The second end of band 106 may be attached to pulley 102 via an attachment means (e.g., a pin, screw, nail or the like) (not shown) as will also be discussed in more detail with respect to FIGS. 8A-8D. Band 108 similarly can be attached to pulley 105 and pulley 104 via an attachment means and a tensioner element, respectively. In some embodiments, the bands 106, 108 are connected to pulleys via tensioner elements at each end (e.g., band 106 is attached to pulley 102 via a tensioner element and to pulley 103 via another tensioner element). According to embodiments, one or both ends of band 106 and band 108 can be attached to the driving member 101 and/or the driven member 107 via a tensioner element. As will be discussed in more detail below, wrapping the band 106, 108 on itself results in a change of diameter (or radius) as the band winds and unwinds. The at least one tensioner element (e.g., tensioner element 110) enables adjustment of the tension of the band 106, 108 (e.g., as it unwinds and/or winds). In embodiments, a controller (not shown) transmits a signal to the tensioner element 110, which slides or pulls band 106 or band 108 tighter (e.g., as the band 106, 108 unwinds) and/or releases tension in band 106 or band 108 (e.g., as it winds). Other configurations for maintaining tension on band 106 and band 108 will be discussed in more detail.

In embodiments, the first band 106 and the second band 108 can be formed of a metal. For example, the metal can be a chemically inert metal including, for example, at least one of stainless steel, titanium, niobium, tantalum, a noble metal, such as ruthenium, rhodium, palladium, silver, osmium, iridium, platinum, gold, rhenium or copper, and combinations thereof. The first band 106 and second band 108 can be formed of a material having a tensile strength of about 200 KSI to about 300 KSI, or about 260 KSI to about 270 KSI. According to embodiments, the first band 106 and the second band 108 are stainless steel (e.g., 301 SS). In embodiments, the thickness of first band 106 and/or the second band 108 is about 0.2 mm to about 5 mm, or about 0.5 mm to about 2.5 mm, or about 1 mm to about 2 mm. In embodiments, the width of the first band and/or the second band is about 10 mm to about 30 mm, or about 15 mm to about 25.

As shown in FIG. 1B, each band 106, 108 wraps on top of itself for certain rotational positions of a robot arm link (not shown), which results in a change in radius from the center of the driven and driving members 101, 107 (e.g., the center of pulleys 102, 103, 104, 105) to the outside radius of the band 106, 108 as each pulley 102, 103, 104, 105 winds and unwinds the bands 106, 108. For example, according to embodiments, when driven member 107 is in a first position, band 106 can be wrapped twice around the outside of the driven member 107. In embodiments, band 106 can be wrapped around driven member 107 about 1.1 times to about 10 times (e.g., up to 1.2 times, 1.3 times, 1.5 times, 1.8 times, about 2 times, 2.5 times, about 3 times, about 4 times, about 5 times, about 6 times, about 7 times, about 8 times, or about 9 times). This first position has a corresponding band radius $r_1$. When driven member 107 is in a second position (not shown), for example is partially unwound, band 106 may be wrapped around driven member 107 only once providing a second radius $r_2$. In embodiments, when driven member 107 is in a third position (not shown), for example, is fully unwound, band 106 may not be wrapped around the driven member 107 at all providing a third radius $r_3$. A corresponding set of radiuses $r_4$, $r_5$ and $r_6$ for band 108 result from the winding and unwinding of driven member 103. Similarly, a corresponding set of radiuses $r_1$-$r_6$ result for belt 106 from the winding and unwinding about driven member 107 and driving member 102. As indicated above, and as will be described in more detail below, knowledge of the position of driving member 101 and driven member 107 and the corresponding radiuses of their pulleys at those positions is useful for controlling the tension of the bands 106, 108 and the phasing of the driving member 101 with respect to the driven member 107.

As shown in FIG. 1A, in embodiments, the pulley 102 can have the same diameter as the pulley 103. Similarly, the pulley 104 can have a same diameter as the pulley 105. That is, a ratio of the size of the driving member 102, 105 to the size of the driven member 103, 104 can be about 1:1. According to embodiments, the ratio also can be about 2:1, about 3:1, about 4:1 and so on. In embodiments, a ratio of the diameter of the pulley 102 to the pulley 103 is about 1:10 to about 10:1, or about 5:1 to about 1:5, or about 4:1 to about 1:4, or about 3:1 to about 1:3, or about 2:1 to about 1:2.

As shown in FIG. 1B, at the point where band 106 and/or band 108 first wraps on top of itself, there is a transition 112 where the band 106, 108 may bend slightly creating a stress point in the band 106, 108. Additionally, when the band 106, 108 wraps upon itself, a friction force is created between the two wraps. To reduce the stress point, one or more of the pulleys 102, 103, 104, 105 may have a spiral shape such that the band 106, 108 forms a spiral about the pulleys to eliminate any step or sharp angle change at the transition.

Figure 2A:
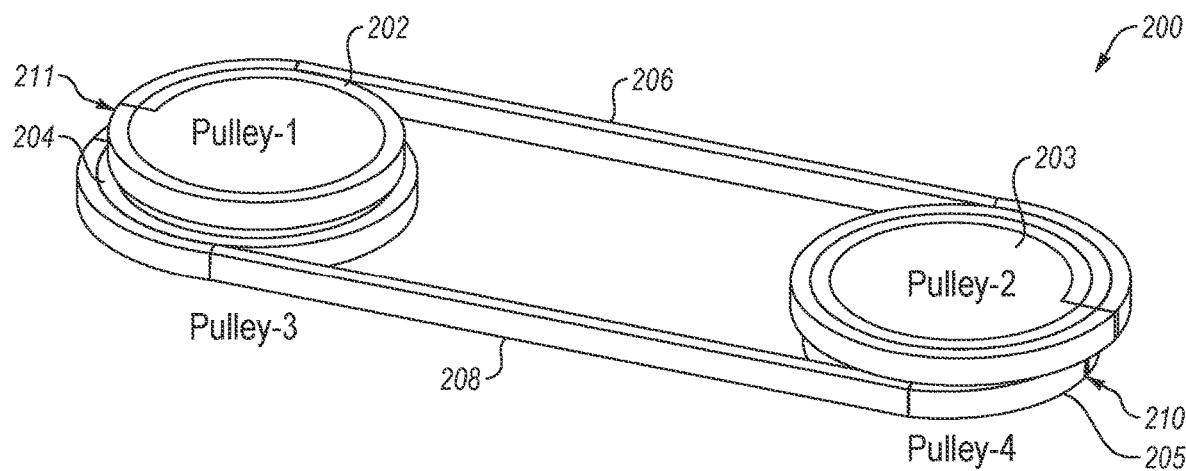
FIG. 2A shows spiral-spiral pulley assemblies for use in a multi-turn drive assembly according to various embodiments.
Figure 2B:
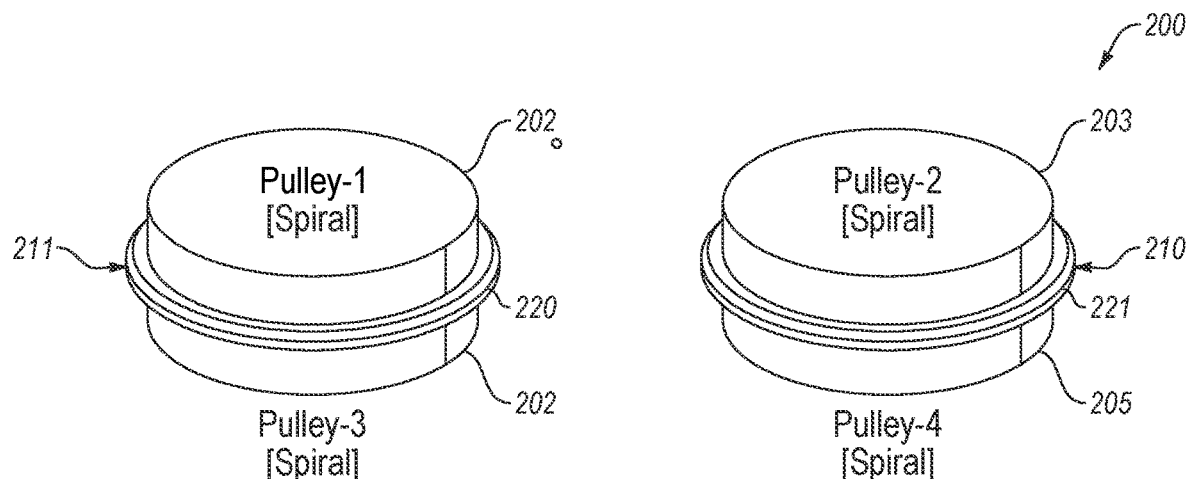
FIG. 2B shows an embodiment of a torsion spring for a spiral-spiral pulley assembly for use in a multi-turn drive assembly according to embodiments.

According to embodiments, the driving member 101 and/or the driven member 107 shown in FIGS. 1A-1B can form a spiral-spiral pulley system or a spiral-cam pulley system. FIGS. 2A and 2B illustrate examples of a spiral-spiral pulley system 200. According to various embodiments, driving member 211 can include a first spiral pulley 202 to which a first band 206 is affixed and a second spiral pulley 204 to which a second band 208 is affixed, wherein the first spiral pulley 202 is attached to the second spiral pulley 204, and wherein the first spiral pulley 202 and the second spiral pulley 204 have a common axis of rotation. Driven member 210 includes a third spiral pulley 203 to which the first band 206 is affixed and a fourth spiral pulley 205 to which the second band 208 is affixed, wherein the third spiral pulley 203 is attached to the fourth spiral pulley 205 via a torsion spring 221, and wherein the third spiral pulley 203 and the fourth spiral pulley 205 have a common axis of rotation. According to embodiments, the first spiral pulley 202 and the third spiral pulley 203 are configured such that during rotation of a robot arm link connected thereto in a first direction between 0° and 180°, a radius of the first spiral pulley 202 increases and a radius of the third spiral pulley decreases 203. In embodiments, the second spiral pulley 204 and the fourth spiral pulley 205 are configured such that during the rotation of a robot arm link attached thereto in the first direction between 0° and 180°, a radius of the second spiral pulley 204 decreases and a radius of the fourth spiral pulley 205 increases.

As shown in FIGS. 2A and 2B, the spiral-spiral pulley 200 system can include a driving member 211 that comprises two spiral pulleys 202, 204. In an example, a first portion of the driving member 211 can form a first spiral pulley 202 and a second portion of the driving member 211 can form a second spiral pulley 204. Similarly, the spiral-spiral pulley system 200 can include a driven member 210 that comprises two spiral pulleys 203, 205. Each pulley 202, 203, 204, 205 can be in the shape of a spiral that enables a band (e.g., 206, 208) to wind around the pulleys 202, 204 and 203, 205 in a spiral configuration (i.e., naturally wraps around the spiral such that there is no step or a minimal step at the point at which the band wraps around itself). In one embodiment, spiral pulley 202, spiral pulley 203, spiral pulley 204, and spiral pulley 205 are sized, shaped, and positioned such that tension remains approximately constant on the bands 206, 208 as it winds around one spiral pulley 202, 203 and unwinds from the other spiral pulley 202, 203. For example, during a rotation that causes the band to wind around spiral pulley 202 and unwind from spiral pulley 203, the radius of a point of spiral pulley 202 may decrease and the radius of a corresponding point of spiral pulley 203 may increase. Similarly, spiral pulley 204 and spiral pulley 205 may be similarly sized, shaped, and positioned such that tension remains approximately constant on band 208 as it winds around one spiral pulley 204, 205 and unwraps from the other spiral pulley 204, 205. In one embodiment, spiral pulleys 202, 203, 204, 205 are sized, shaped and positioned such that there is less than a threshold delta between belt tension on belt 206 and belt tension on belt 208 as belt 206 unwinds and belt 208 winds, and as belt 206 winds and belt 208 unwinds.

Even with careful arrangement and configuration of the spiral pulleys 202, 203, 204, 205, a delta may be caused for some rotation angles between the tension on band 206 and the tension on band 208. For example, assume that spiral pulley 202 is rigidly attached to spiral pulley 204, that spiral pulley 203 is rigidly attached to spiral pulley 205, and that band 206 is infinitely stiff. As spiral pulley 202 and spiral pulley 204 are rotated together for 360 degrees, spiral pulley 203 may rotate 361.2 degrees, and spiral pulley 205 may rotate 358.8 degrees. Thus, there may be a delta in the amount that spiral pulley 203 and spiral pulley 205 rotate to accommodate a 360 degree rotation of spiral pulleys 202, 204. This can cause a belt tension variation between belt 206 and belt 208, which would cause the elongation of one or more of the belts and ultimately failure. In embodiments, the spiral pulleys 202, 203, 204, 205 are configured to minimize a variation in the amount that spiral pulley 203 and spiral pulley 205 each need to rotate to accommodate rotation of spiral pulleys 202 and 204, respectively. In embodiments, the spiral pulleys 202, 203, 204, 205 are configured to minimize belt tension variation between the belts 206, 208 as the pulleys rotate.

In some embodiments, spiral pulley 203 and spiral pulley 205 do not have a fixed rotation relative to one another. In an embodiment, a torsion spring 221 separates spiral pulley 203 from spiral pulley 205. Additionally, or alternatively, a torsion spring 220 may separate spiral pulley 202 from spiral pulley 204. Notably, in embodiments, the torsion spring 220, 221 may be configured so as not to protrude from the surface between the pulleys 202, 204 and 203, 205, and may be flush with the outer surface of each pulley 202, 204 and 203, 205, or may have a diameter that is less than the diameter of the two pulleys 202, 204 and 203, 205. The torsion spring 220, 221 may also act as a divider to help maintain separation between the bands (e.g., 206, 208).

The torsion spring 221 can help keep tension on the bands (e.g., 206, 208) nearly constant or within a range and can reduce stress in the bands (e.g., 206, 208). Additionally, or alternatively, the torsion spring can distribute tension between the bands 206, 208 such that the bands have an equal or approximately equal tension to one another. For example, if more tension would be applied to a particular band, the delta in tension would be absorbed by the torsion spring 221, which results in an unequal rotation between spiral pulley 203 and spiral pulley 205. Without a torsion spring, as a band winds on itself, its wrap radius around the pulley increases, which can increase the stress and tension on the band. When the band unwraps, the wrap radius around the pulley decreases and can result in too much slack and/or reduced tension in the band. Over time, the stretching and relaxing of the band may eventually cause the band to break. When there is no torsion spring in a spiral-spiral pulley assembly, there may be additional belt stretch/slack of about 1.6 mm (0.010" belt thickness) due to difference between the driver pulley and driven pulley angle of 1.2° for 360° rotation. This stretch can result in total stress of about 110 KSI (about 228 Hz, about 1000 to about 1200N Tension) at end of 360° rotation. When a torsion spring 221 having a stiffness K (e.g., about 25 Nm/deg to about 100 Nm/deg, or about 75 Nm/deg) is used, the torsion spring can absorb the additional belt stretch and provide a close to desired constant pretension for example about 100 Hz to about 200 Hz, or about 125 Hz to about 175 Hz, or about 135 Hz, at a tensile load of about 450 N to about 650 N, or about 550N. In embodiments, the torsion spring 221 can be configured to maintain the tension in the band below a threshold value (e.g., 135 Hz up to a rotation of about 420°) and at or above a minimum value to take up any excess slack in the band. Torsion spring 221 provides a degree of freedom between the two pulleys 203, 205 in driven member 210 and reduces or eliminates any potential band failure points.

The torsion spring 220, 221 is configured to twist along its axis and to store mechanical energy when twisted. When the torsion spring 220, 221 untwists, the mechanical energy is slowly released in a longitudinal direction of the band. The torsion spring 220, 221 has a linear or near linear response within a threshold range of motion and provides a compliant spring that maintains the tension in the band from about 135 Hz±10 Hz corresponding to a tension load of about 450 N to about 650 N during operation of the pulley assemblies. Because the torsion spring 220, 221 twists plus or minus, e.g., 50 degrees, it can maintain a fairly constant torque, which results in a constant tension in the band. For example, the torsion spring 221 helps maintain a constant or nearly constant tension on the bands 206, 208 when winding and unwinding on the pulleys 203, 205. As discussed above, because bands 206, 208 wrap upon themselves, as they wind and unwind the radius changes in embodiments. If not adjusted, the tension in one or both of the bands 206, 208 can become too slack, which may prevent one or both of the driven pulleys 203, 205 from properly moving and ultimately, the robot arm (not shown) from rotating appropriately.

For example, if pulley 202 and pulley 204 rotate 360 degrees, then, assuming the belts 206, 208 are infinitely stiff, pulley 203 may rotate about 361.2 degrees, and pulley 205 may rotate about 358.8 degrees (±1.2 degrees difference in rotation). Because of this changing wrap radius around pulleys 203, 205, the belts can stretch, which results in belt tension variation causing elongation of the belts and ultimately failure. The torsion spring 220, 221 is a compliant element so that belt stress does not exceed a threshold. The torsion spring 220, 221 can have a K value representing some stiffness (e.g., for a belt having a thickness of about 10 mils, a spiral pulley diameter of about 150 mm, the K value of the torsion spring can be about 50 Nm/degree to about 100 Nm/degree, or about 75 Nm/degree), and K times theta (i.e., the angle of rotation) is equal to the force. For a constant torsion spring, if the rotation is, e.g., ±20 or ±30 degrees of rotation, and K is constant, or at least linearly very close to a one, or constant in some range of motion, the pulleys 202, 204 and 203, 205 can move relative to each other, but the torsion spring maintains the same torque between them, which maintains the same force in the bands.

According to embodiments, the spiral-spiral pulley configuration 200 can have two driver pulleys 202, 204 and two driven pulleys 203, 205. The driver pulleys 202, 204 can have a commanded rotation of 0° to 360°+. Driven pulley 203 can lead by about 0.2° to about 2.5°, or about 0.5° to about 2.0°, or about 1.2° for 360° driver rotation while driven pulley 205 lags by about 0.2° to about 2.5°, or about 0.5° to about 2.0°, or about 1.2° for 360° driver rotation. FIG. 6A shows the rotation profile of each spiral-spiral pulley assembly 202, 203 and 204, 205. If the driver pulleys 202, 204 rotate 360 degrees, the driven pulleys 202, 204 will rotate relative to each other by about 2.4 degrees in an embodiment. Accordingly, the torsion spring allows the about 2.4 degrees relative rotation between the driven pulleys 203, 205 while maintaining an effectively constant and equal tension in both of the bands. Notably, the two bands 206, 208 are in equilibrium, so it can be assumed that the tensions are about equal. Although the moments are the same due to the torsion spring, because of the slightly different radiuses, the forces in each of the bands may differ slightly.

Figure 2C:
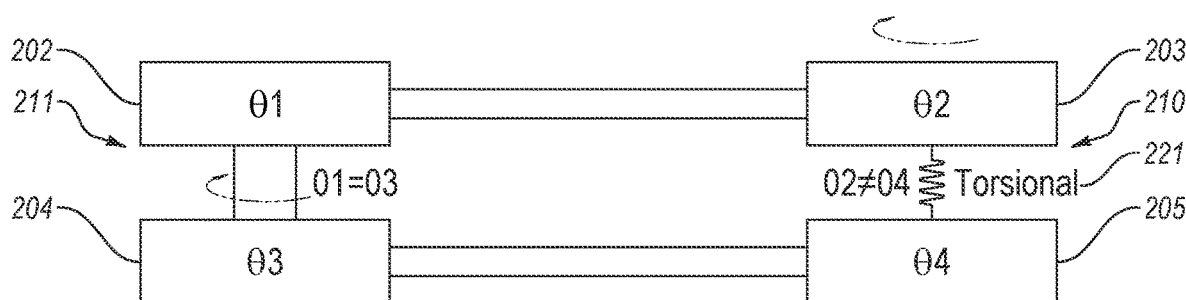
FIG. 2C shows an embodiment of a torsion spring for a spiral-spiral pulley assembly for use in a multi-turn drive assembly according to embodiments.

As shown in FIG. 2C, spiral pulley 202 and spiral pulley 204 may be rigidly attached to one another such that they have a fixed rotational relationship to one another. Accordingly, a rotation θ1 of spiral pulley 202 is equal to the rotation θ3 of spiral pulley 204. However, because of the torsion spring 221 in series with spiral pulley 203 and spiral pulley 205, as belts 206, 208 drive spiral pulley 203 and spiral pulley 205, respectively, torsion spring 221 twists, causing the rotation θ2 of spiral pulley 203 to differ from the rotation θ4 of spiral pulley 205.

Figure 2D:
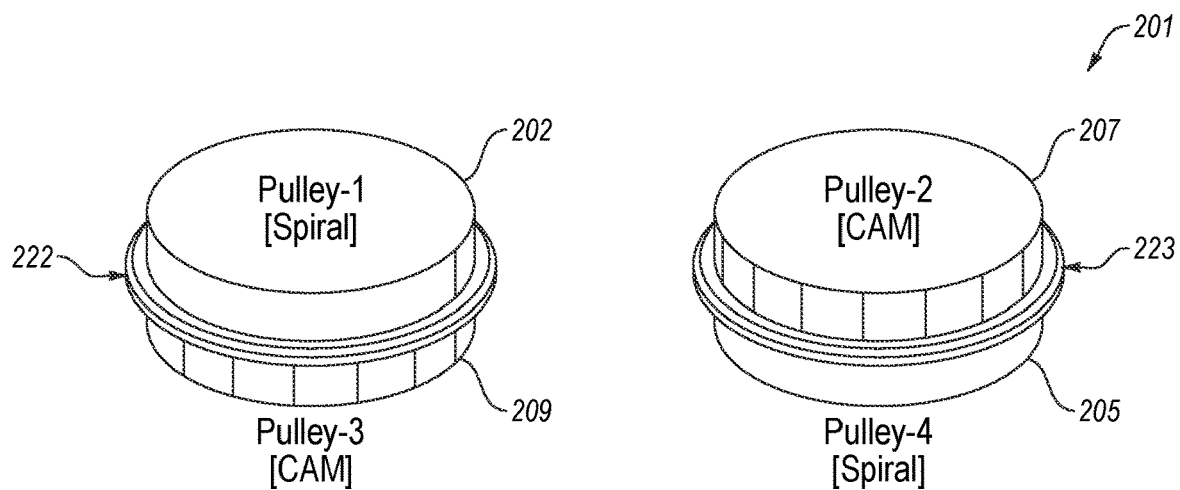
FIG. 2D shows embodiments of spiral-cam pulley assemblies for use in a multi-turn drive assembly according to various embodiments.

According to further embodiments, the pulley system shown in FIGS. 1A-1B can be a spiral-cam pulley system 201 as shown in FIG. 2D. According to various embodiments, the driving member 222 can include a first spiral pulley 202 to which a first band (not shown) is affixed and the driven member 223 can include a first cam pulley 207 to which the first band is affixed, the first cam pulley 207 having a different shape from the first spiral pulley 202. The driving member 222 can further include a second cam pulley 209 to which a second band (not shown) is affixed, wherein the second cam pulley 209 is attached to the first spiral pulley 202, and wherein the second cam pulley 209 and the first spiral pulley 202 have a common axis of rotation; and the driven member 223 can further include a second spiral pulley 205 to which the second band is affixed, wherein the second spiral pulley 205 is attached to the first cam pulley 207, and wherein the second spiral pulley 205 and the first cam pulley 207 have a common axis of rotation.

In embodiments of the drive assembly, the first cam pulley 207 can have an approximately elliptical cross-section. In embodiments, the first spiral pulley 202 and the first cam pulley 207 can have the same angular position at 0° and 180°, wherein the first spiral pulley 202 and the first cam pulley 207 have different angular positions between 0° and 180° and between 180° and 360°.

As shown in FIG. 2D, The spiral-cam pulley system 201 is similar in configuration to spiral-spiral pulley system 200, except that spiral pulley 203 is replaced with a cam pulley 207, and spiral pulley 204 is also replaced with a cam pulley 209. Accordingly, the spiral-cam pulley system 201 includes a driving member 222 with spiral pulley 202 and cam pulley 209 and a driven member 223 with cam pulley 207 and spiral pulley 205. Additionally, there may be no torsion spring separating cam pulley 207 and spiral pulley 205 (though a torsion spring may still be used). The cam pulleys 209, 207 have shapes that are close to a spiral shape and/or close to an oval shape and/or close to an elliptical shape in embodiments. The specialized shapes of the cam pulleys 207, 209 can cause the cam pulley 207 and spiral pulley 205 to rotate an equal or approximately equal amount while maintaining an equal or approximately equal force on the bands 206, 208.

Because the cam pulleys 207, 209 are shaped in a way to maintain equal tension on the bands 106, 108, the spiral-cam pulley system may omit a torsion spring (e.g., between the cam pulley 207 and spiral pulley 205). That is, a torsion spring is optional in each spiral-cam pulley component (i.e., in the driving member and the driven member). In embodiments without a torsion spring, the spiral and cam pulleys 202, 209 can be machined together to provide a single body that includes both pulleys. Similarly, the spiral and cam pulleys 205, 207 can be machined together to provide a single body that includes both pulleys. Alternatively, each of the pulleys 202, 205, 207, 209 can be formed separately and attached via a connector.

Each spiral pulley 202, 205 can have a spiral shape that is nearly in the shape of a cylinder that enables a band (e.g., 206, 208) to wind around the pulley 202, 205 in a spiral configuration (i.e., naturally wraps around the cylinder). Each cam pulley 207, 209 can have a shape that is close to the shapes of the spiral pulleys, but be configured so that the band (e.g., 206, 208) can wind around the pulley 207, 209 in a non-spiral configuration (i.e., wraps unevenly around the cam). For example, each cam pulley 207, 209 can be approximately elliptical or ovular in shape. In embodiments, each cam pulley 207, 209 can be close to elliptical, but not a perfect ellipse.

Figure 2E:
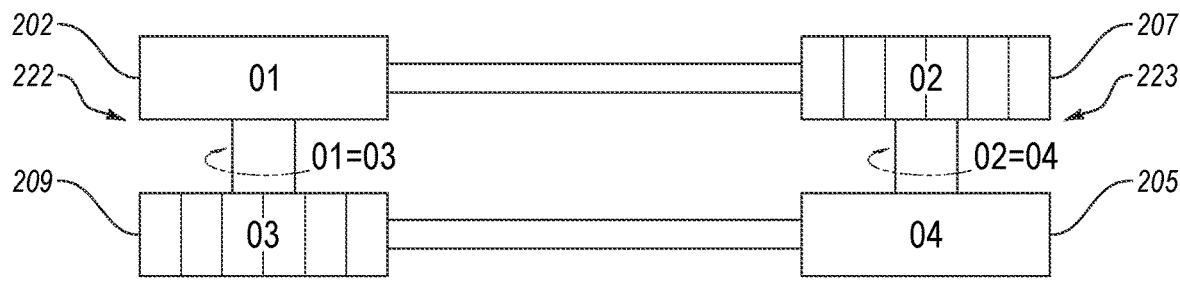
FIG. 2E shows a diagram of a spiral-cam pulley assembly for use in a multi-turn drive assembly according to various embodiments.

FIG. 2E shows that spiral pulley 202 and cam pulley 209 are rigidly attached together, and spiral pulley 205 and cam pulley 207 are rigidly attached together. As driving member 222 rotates, an amount of rotation θ1 of the spiral pulley 202 is equal to an amount of rotation θ3 of cam pulley 209. Rotation of spiral pulley 202 drives belt 206, which in turn rotates cam pulley 207. Similarly, rotation of cam pulley 209 drives belt 208, which in turn rotates spiral pulley 205. An amount of rotation θ2 of cam pulley 207 is equal to an amount of rotation θ4 of spiral pulley 205 because of the configuration of spiral pulleys 202, 205 and cam pulleys 207, 209.

Figure 2F:
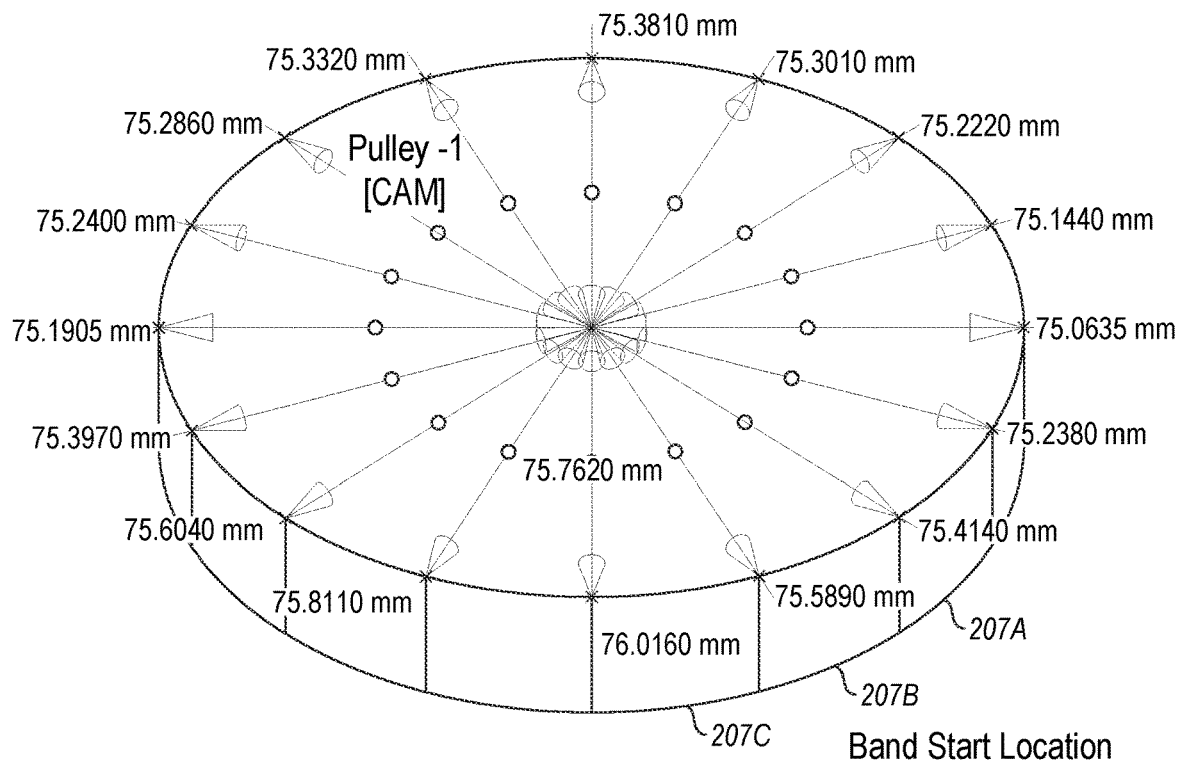
FIG. 2F shows a radius profile of a cam pulley for use in a multi-turn drive assembly according to various embodiments.

As shown in FIG. 2F, each cam pulley 207, 209 can be formed (e.g., machined) of sections 207A, 207B, 207C, etc., such that each section has a characteristic radius between the center of the cam pulley 207, 209 and the outer surface of the particular section 207A, 207B, 207C, etc. at a characteristic angle. In embodiments, the radius of each cam section 207A, 207B, 207C, etc. can be uniform or can vary within the section. Each section 207A, 207B, 207C, etc. can have a radius that has been interpolated. For example, if there are 16 segments around the 360° surface of the cam pulley 207, 209, or eight (8) segments for every 180 degrees, if it is interpolated two times finer, there will be 16 segments for every 180 degrees; two times finer will be 32 segments for every 180 degrees up to some presumably infinitesimal segment that can theoretically create a smooth surface. The band unwrapment (or wrapment) is uniformly distributed onto the segments, such that the cam pulley radius is a function of the belt unwrapment (or wrapment). Once radius and wrapment are correlated and known, the cam pulley radius can be used to determine the actual rotation of the driven pulley.

According to example embodiments, interpolation for the non-spiral cam profile with polar coordinates {R2, θ2} may be calculated as follows. For polar coordinates of θ2{0°→180°} R2{75.1905→75.3175}:

$$\theta full1 = (180) \cdot \frac{\pi}{180} = 3.142$$

$$Ri := 75.1905 = 75.191$$

$$\theta2 := \frac{(90.038)\pi}{180} = 1.571$$

$$Rf := 75.3175 = 75.317$$

$$S1 := \frac{237.6144}{1} = 237.614$$

Where Ri represents the radius at which the belt will wrap on cam pulley 1 at the start of the segment with angular span $\theta full_1$ (e.g., 180°, 90.038°, 67.621° and 45.142°), Rf represents the radius at which the belt will wrap on cam pulley 1 at the end of the segment with angular span $\theta full_1$ (e.g., 180°, 90.038°, 67.621° and 45.142°), S1 represents the length of belt unwrapped (e.g., 237.614 mm) from the driver spiral pulley 2 during $\theta full_1$, and θ2 represents the polar angle (e.g., 90.038°) on driven cam pulley 2 at which the polar radius is R2 Interpolation can then be performed according to the following:

$$\left[Ri \cdot \theta2 + \left(\frac{\theta2^2}{2}\right)\frac{(R2 - R_i)}{\theta2}\right] = \frac{S1}{2}$$

$$\frac{S1 - R_i \cdot \theta2}{\theta2}$$

$$R2fi := \frac{S1 - R_i \cdot \theta2}{\theta2} = 76.016$$

$$\left[R2 \cdot (\theta full1 - \theta2) + \left[\frac{(\theta full1 - \theta2)^2}{2}\right] \cdot \frac{(Rf - R2)}{(\theta full1 - \theta2)}\right] =$$

$$\frac{S1}{2} - \frac{S1 + Rf \cdot \theta2 - Rf \cdot \theta full1}{\theta2 - \theta full1}$$

$$\left[R2 \cdot (\theta full1 - \theta2) + \left[\frac{\theta full1 - \theta2)^2}{2}\right] \cdot \frac{(Rf - R2)}{(\theta full1 - \theta2)}\right] =$$

$$\frac{S1}{2} - \frac{S1 + Rf \cdot \theta2 - Rf \cdot \theta full1}{\theta2 - \theta full1}$$

$$R2se := -\frac{S1 + Rf \cdot \theta f \cdot \theta2 - Rf \cdot \theta full1}{\theta2 - \theta full1} = 76.016$$

$$Diff := R2fi - R2se = -0.0007392$$

Accordingly, the cam profile polar coordinates are {R76.016, 90.038°} for cam pulley 207 in the above example.

For polar coordinates of θ2{0°→90.038°} R2{75.1905→76.016}:

$$\theta full1 := (90.038) \cdot \frac{\pi}{180} = 1.571$$

$$Ri := 75.1905 = 75.191$$

$$\theta2 := \frac{(45.147)\pi}{180} = 0.788$$

$$Rf := 76.016 = 76.016$$

$$S1 := \frac{237.6144}{2} = 118.807$$

Interpolation can then be performed according to the following:

$$\left[Ri \cdot \theta2 + \left(\frac{\theta2^2}{2}\right)\frac{(R2 - R_i)}{\theta2}\right] = \frac{S1}{2}$$

$$\frac{S1 - R_i \cdot \theta2}{\theta2}$$

$$R2fi := \frac{S1 - R_i \cdot \theta2}{\theta2} = 75.604$$

$$\left[R2 \cdot (\theta full1 - \theta2) + \left[\frac{(\theta full1 - \theta2)^2}{2}\right] \cdot \frac{(Rf - R2)}{(\theta full1 - \theta2)}\right] =$$

$$\frac{S1}{2} - \frac{S1 + Rf \cdot \theta2 - Rf \cdot \theta full1}{\theta2 - \theta full1}$$

$$R2se := -\frac{S1 + Rf \cdot \theta f \cdot \theta2 - Rf \cdot \theta full1}{\theta2 - \theta full1} = 75.604$$

$$Diff := R2fi - R2se = -0.0007511$$

Accordingly, the cam profile polar coordinates are {R75.604, 45.142°} for cam pulley 207 in the above example.

For polar coordinates of θ2{45.142°→90.038°}R2{75.604→76.016}:

$$\theta full1 := \frac{(90.038 - 45.142)\pi}{180} = 0.784$$

$$Ri := 75.604 = 75.604$$

$$\theta2 := \frac{(67.6205 - 45.142)\pi}{180} = 0.392$$

$$Rf := 76.016 = 76.016$$

$$S1 := \frac{237.6144}{4} = 59.404$$

$$\left[Ri \cdot \theta2 + \left(\frac{\theta2^2}{2}\right)\frac{(R2 - R_i)}{\theta2}\right] = \frac{S1}{2}$$

$$\frac{S1 - R_i \cdot \theta2}{\theta2}$$

$$R2fi := \frac{S1 - R_i \cdot \theta2}{\theta2} = 75.811$$

$$\left[R2 \cdot (\theta full1 - \theta2) + \left[\frac{(\theta full1 - \theta2)^2}{2}\right] \cdot \frac{(Rf - R2)}{(\theta full1 - \theta2)}\right] =$$

$$\frac{S1}{2} - \frac{S1 + Rf \cdot \theta2 - Rf \cdot \theta full1}{\theta2 - \theta full1}$$

$$R2se := -\frac{S1 + Rf \cdot \theta f \cdot \theta2 - Rf \cdot \theta full1}{\theta2 - \theta full1} = 75.811$$

$$Diff := R2fi - R2se = -0.0000128$$

Accordingly, the cam profile polar coordinates are {R75.811, 67.621°} for cam pulley 207 in the above example.

The above interpolation method can be used, for example, when the driver pulley has a spiral profile and the driven pulley has a cam profile. The initial boundary conditions prior to the cam profile interpolation may be as follows:

S1 represents belt wrapment on driver/spiral pulley;
S2 represents belt wrapment on driven/cam pulley;
When the driver/spiral pulley rotates 360°, the driven/cam pulley should also rotate 360°;
S1 (0° to 360°)=S2 (0° to 360°);
Radius_cam (360°=Radius_cam (0°)+Belt thickness where Radius(0°) will be known input value;
Radius_cam)(180°=Average)[Radius(360°), Radius (0°)]
When driver/spiral pulley rotates 180°, the driven/cam pulley should also rotate 180°,
S1 (0° to 180°)=S2 (0° to 180°);

Using the above boundary conditions, the polar coordinates [Radius_cam(θ_mid), θ_mid] for the cam pulley can be interpolated:

S2 (0° to θ_mid)=S2(θ_mid to 180°)=S1 (0° to 180°)/2;
Radius_cam (0°), Radius_cam(180°) are known values;
Solve for θ_mid and Radius_cam(θ_mid);

The above approach for determining the boundary conditions can be repeated until there are, for example, 16 segments spanning 360°. According to embodiments, interpolating more than 16 segments may have minimal impact on belt stress variation. In embodiments, the number of segments can be from 2 to 32, or 8 to 16, or 16.

According to one embodiment, the non-spiral cam pulley profile can be determined using the following interpolations:

second end of the band. Belt unwrap length at Spiral Pulley-1=Belt wrap length at Pulley-2 for any given rotation angle or spiral pulley-1 (e.g. 237.61 mm for 180° in Tables 1A-1B).

To determine the cam pulley polar coordinates, wrap length on Cam Pulley-2 can be uniformly distributed over 8 segments for 0°→180° and similarly for 180°→360°. As shown in the table, =belt wrap length on Cam Pulley-2 is $$\frac{237.61}{2}$$

mm when rotated from 0°→90.038° and 90.038°→180°. Additionally, belt wrap length on Pulley-2 is $$\frac{237.61}{4}$$

mm when rotated from 0°→45.142°, 45.142°→90.038°, 90.038→134.915°, and 134.915°→180°. Additionally, belt wrap length on Pulley-2 is $$\frac{237.61}{8}$$

TABLE 1

Interpolation data for determining a non-spiral cam pulley profile

| Spiral Pulley-1 Parameters | | | | | Non-Spiral [or] CAM Pulley-2 Parameters | | | | |
|---|---|---|---|---|---|---|---|---|---|
| Pulley-1 Angular Displacement [θ1] [deg] | Pulley-1 Rotation Position [θ1'] [Rad] | Pulley-1 Radius [R1] [mm] | Belt Wrap on Pulley-1 [s1] [mm] | Delta S1 Wrap [mm] | Pulley-2 Angular Displacement [θ2] [deg] | Pulley-2 Rotation Position [θ2] [Rad] | Pulley-2 Radius [R2] [mm] | Belt Wrap on Pulley-2 [S2] [mm] | Delta S2 Wrap [mm] |
| 0 | 17.28 | 75.6985 | 1301.9 | 0.0000 → | 0.000 | 4.71 | 75.1905 | 353.9 | 0.0000 |
| 22.5 | 16.89 | 75.6826 | 1272.2 | 29.7236 | 22.602 | 5.11 | 75.3970 | 383.6 | 29.7218 |
| 45 | 16.49 | 75.6668 | 1242.5 | 59.4410 | 45.142 | 5.50 | 75.6040 | 413.3 | 59.4035 |
| 67.5 | 16.10 | 75.6509 | 1212.8 | 89.1521 | 67.621 | 5.89 | 75.8110 | 443.0 | 89.1060 |
| 90 | 15.71 | 75.6350 | 1183.1 | 118.8571 | 90.038 | 6.28 | 76.0160 | 472.7 | 118.8072 |
| 112.5 | 15.32 | 75.6191 | 1153.4 | 148.5567 → | 112.451 | 6.68 | 75.8430 | 502.4 | 148.5094 |
| 135 | 14.92 | 75.6033 | 1123.7 | 178.2482 | 134.915 | 7.07 | 75.6680 | 532.1 | 178.2109 |
| 157.5 | 14.53 | 75.5874 | 1094.0 | 207.9344 | 157.431 | 7.46 | 75.4920 | 561.8 | 207.9122 |
| 180 | 14.14 | 75.5715 | 1064.3 | 237.6144 | 180.000 | 7.85 | 75.3175 | 591.5 | 237.6144 |
| 202.5 | 13.74 | 75.5556 | 1034.7 | 267.2881 → | 202.545 | 8.25 | 75.3980 | 621.2 | 267.2665 |
| 225 | 13.35 | 75.5398 | 1005.0 | 296.9556 | 225.066 | 8.64 | 75 4760 | 650.8 | 296.9182 |
| 247.5 | 12.96 | 75.5239 | 975.3 | 326.6169 | 247.564 | 9.03 | 755550 | 680.5 | 326.5704 |
| 270 | 1257 | 75.5080 | 945.7 | 356.2719 | 270.038 | 9.43 | 75.6350 | 710.1 | 356.2222 |
| 292.5 | 12.17 | 75.4921 | 916.0 | 385.9207 → | 292.508 | 9.82 | 75.5860 | 739.8 | 385.8748 |
| 315 | 11.78 | 75.4763 | 886.4 | 415.5633 | 314.991 | 10.21 | 75.5400 | 769.4 | 415.5259 |
| 337.5 | 11.39 | 75.4604 | 856.7 | 445.1996 | 337.488 | 10.60 | 75.4940 | 799.1 | 445.1774 |
| 360 | 11.00 | 75.4445 | 827.1 | 474.8297 | 360.000 | 11.00 | 75.4445 | 828.7 | 474.8299 |
| 382.5 | 10.60 | 75.4286 | 797.5 | 504.4536 → | 382.602 | 11.39 | 75.6500 | 858.3 | 504.6319 |
| 405 | 10.21 | 75.4128 | 767.9 | 534.0712 | 405.142 | 11.78 | 75.2550 | 887.9 | 534.4335 |
| 427.5 | 9.82 | 75.3969 | 738.3 | 563.6826 | 427.621 | 12.18 | 76.0610 | 917.6 | 564.2357 |
| 450 | 9.42 | 75.3810 | 708.7 | 593.2878 | 450.038 | 12.57 | 76.2650 | 947.2 | 594.0363 |
| 472.5 | 9.03 | 75.3651 | 679.1 | 622.8867 → | 472.451 | 12.96 | 76.1030 | 976.8 | 623.8378 |
| 495 | 8.64 | 75.3493 | 649.5 | 652.4794 | 494.915 | 13.35 | 75.9290 | 1006.4 | 653.6389 |
| 517.5 | 8.25 | 75.3334 | 619.9 | 682.0659 | 517.431 | 13.74 | 75.7540 | 1035.9 | 683.4400 |
| 540 | 7.85 | 75.3175 | 590.3 | 711.6461 | 540.000 | 14.14 | 75.5810 | 1065.5 | 711.2422 |

For the interpolation set forth in Tables 1A-1B, spiral pulley-1 (e.g., corresponding to spiral pulley 202 or 205) may connect to a first end of a band and cam pulley-2 (e.g., corresponding to cam pulley 207 or 209) may connect to a mm when rotated from 0°→22.602°, 22.602°→45.142°, and 157.431°→180°.

As discussed above, the geometry of the resulting cam pulley 207, 209 is not a circle. In embodiments, the cam pulley 207, 209 is shaped so that as the band 206, 208 winds and unwinds, the tension on the band remains largely constant. For example, as the band 206, 208 winds on itself around the cam pulley 207, 209, the radius of the cam pulley 207, 209 can decrease and maintain a constant tension. Contrarily, if the band 206, 208 unwinds from the cam pulley 207, 209, the radius of the cam pulley 207, 209 can increase to maintain a constant tension. According to embodiments, the big points or largest radius in each cam pulley 207, 209 is at 90 degrees and 270 degrees.

Figure 2G:
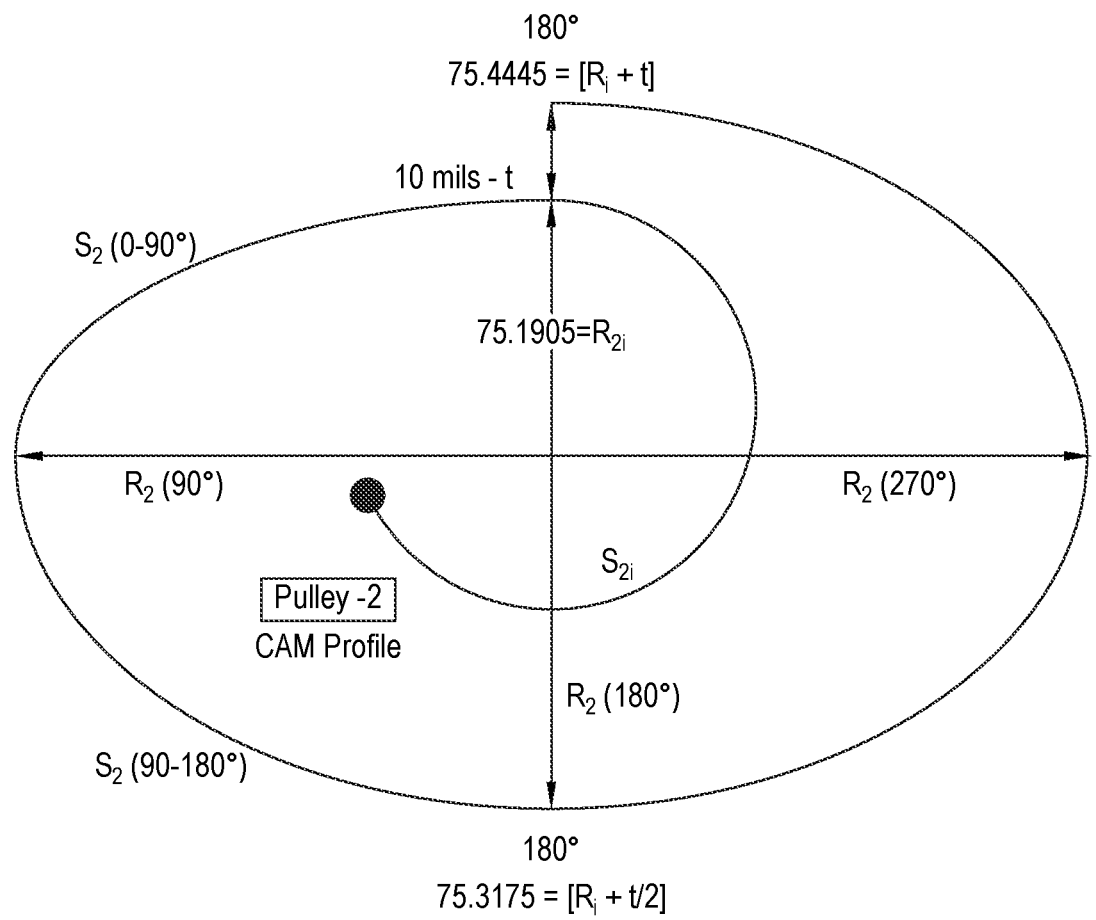
FIG. 2G shows a radius profile of a cam pulley for use in a multi-turn drive assembly according to various embodiments.

FIG. 2G shows a radius profile of a cam pulley according to embodiments. In FIG. 2G, the radius is shown at different angles. The radius peaks at 90° and 270°. According to embodiments, θ1=θ2 at 0°, 180° and 360°, where θ1 is the rotation of a spiral pulley attached to one end of a belt, and where θ2 is the rotation of the cam pulley attached to an opposite end of the belt. Additionally, θ1≠θ2 between 0° and 180°, between 180° and 360°, and >360°. Additionally, S2[0 to 360]=S1[0° to 360° ], and S2[0° to 180° ]=S1[0° to 180° ], where S2 is the belt wrapment on the driven/cam pulley and S1 is the belt wrapment on the driver/spiral pulley. Notably, the spiral and cam pulleys are formed to overlay at 0° and 180°, but the spiral and cam pulley profiles diverge in between these angles. From 0° to 360°, for the spiral pulley, the radius can linearly decrease from about 75.6985 mm to about 75.4445 mm; the delta will be the belt thickness of 0.254 mm or 0.010 in. For cam pulley, the radius can increase from about 75.1905 mm to about 75.4445 mm; similarly, the delta will be the belt thickness of about 0.254 mm or about 0.010 in.

As shown in FIG. 2G, the cam profile from 0° to 90° and from 360° to 450° has the same increase in profile, but the band has wrapped over itself at those angles. Thus, the profile has the same shape curve, but is offset by the thickness of the band. As shown in FIG. 2G, the band spiral will keep increasing to the right hand side because once the band wraps beyond 360°, it begins to wrap on itself, which causes the radius to increase.

The shape of the cam pulley is formed with respect to the unwrapment of the belt (i.e., length of the belt that moves from the spiral pulley toward the cam pulley relative to a fixed point). According to example embodiments, when the spiral pulley 202, 205 rotates 180 degrees, the unwrapment of the belt is measured. Based on that unwrapment, the peak radius at 90 degrees can be determined, so that the wrapment onto the cam pulley 207, 209 is equal to the unwrapment at 180 degrees. After numerically determining the radius at 90 degrees, then the wrapment of the belt onto the cam pulley 207, 209 from zero to 90 degrees can be determined. The wrapment (i.e., the length of the belt) is distributed into segments 207A, 207B, 207C, etc., for example, four (4) segments. Other ways of determining the profile of a cam surface are known to those of ordinary skill in the art. The cam pulley 207, 209 profile should be designed to allow for rotation of the pulleys 202, 205 (and any robot arms attached thereto) by more than 360° while keeping tension in the band within optimal design limits (i.e., to keep tension in the band below a stress point and above a slack point). In a spiral-cam pulley assembly 201, shaping the cam pulley 207, 209, for example as described above, reduces the delta (i.e., the difference) between the lead and lag rotations of the driven pulley 207, 209 and driving pulley 202, 205, so that the delta is minimized, which minimizes belt stress to below a stress threshold.

According to embodiments, with spiral-cam pulley assemblies 201 the transmission stiffness can be higher than with spiral-spiral pulley assemblies. In spiral-spiral pulley assemblies a load is placed on the driver pulley and that torque is transmitted to the driven pulley. As the driven torque increases, the belt can stretch and the transmitted force increases. If a torsion spring is employed in a spiral-spiral pulley assembly, the force will be no greater than the torsion spring; therefore, the band is more compliant and the tension on the band is softer. The torsion spring is in series with the transmission. In a spiral-cam pulley assembly, no torsion spring is used in embodiments; thus, there is no element in series to soften the tension. Consequently, a spiral-cam pulley assembly has a comparatively stiffer input-output transmission.

A robot having a spiral-cam pulley system that rotates one or more robot arms 360°+, can be programmed to control rotation of the pulleys to achieve a desired rotation of the one or more robot arms. Data representing the angle increments of the cam pulley can be stored in a memory accessible by the robot's controller. For example, if the cam pulley is divided into 16 segments having varying radiuses, the actual rotation will overlap onto multiple segments between 0° and 180° and between 180° and 360°. According to embodiments, the data representing an upper band transmission of a spiral-cam pulley system can be as shown in Tables 2A and 2B.

TABLE 2A

Rotation of the driver spiral pulley
Spiral Pulley-1 Commanded Rotations

| Pulley-1 Angular Displacement [θ1][deg] | Pulley-1 Rotation Position [θ1'][Rad] | Pulley-1 Radius [R1][mm] | Belt Wrap on Pulley-1 [s1][mm] | Delta S1 Wrap [mm] |
|---|---|---|---|---|
| 0 | 17.28 | 75.6985 | 1301.9 | 0.000 |
| 22.5 | 16.89 | 75.6826 | 1272.2 | 29.724 |
| 45 | 16.49 | 75.6668 | 1242.5 | 59.441 |
| 67.5 | 16.10 | 75.6509 | 1212.8 | 89.152 |
| 90 | 15.71 | 75.6350 | 1183.1 | 118.857 |
| 112.5 | 15.32 | 75.6191 | 1153.4 | 148.556 |
| 135 | 14.92 | 75.6033 | 1123.7 | 178.248 |
| 157.5 | 14.53 | 75.5874 | 1094.0 | 207.934 |
| 180 | 14.14 | 75.5715 | 1064.3 | 237.614 |
| 202.5 | 13.74 | 75.5556 | 1034.7 | 267.288 |
| 225 | 13.35 | 75.5398 | 1005.0 | 296.956 |
| 247.5 | 12.96 | 75.5239 | 975.3 | 326.617 |
| 270 | 1257 | 75.5080 | 945.7 | 356.272 |
| 292.5 | 12.17 | 75.4921 | 916.0 | 385.921 |
| 315 | 11.78 | 75.4763 | 886.4 | 415.563 |
| 337.5 | 11.39 | 75.4604 | 856.7 | 445.200 |
| 360 | 11.00 | 75.4445 | 827.1 | 474.830 |
| 382.5 | 10.60 | 75.4286 | 797.5 | 504.454 |
| 405 | 10.21 | 75.4128 | 767.9 | 534.071 |
| 427.5 | 9.82 | 75.3969 | 738.3 | 563.683 |
| 450 | 9.42 | 75.3810 | 708.7 | 593.288 |
| 472.5 | 9.03 | 75.3651 | 679.1 | 622.887 |
| 495 | 8.64 | 75.3493 | 649.5 | 652.479 |
| 517.5 | 8.25 | 75.3334 | 619.9 | 682.066 |
| 540 | 7.85 | 75.3175 | 590.3 | 711.646 |

TABLE 2B

Rotation of the driven cam pulley as a result of the rotation of the driver spiral pulley Non-Spiral [or] CAM Pulley-2 Actual Rotations

| Pulley-2 Angular Displacement [02] [deg] | Pulley-2 Rotation Position [02] [Rad] | Pulley-2 Radius [R2] [mm] | Belt Wrap on Pulley-2 [S2] [mm] | Delta S2 Wrap [mm] | | Belt Free Length [Lfree] [mm] | Total Belt Length [Lfree] [mm] | Belt Length [Lbelt] [mm] | [02-01] [deg] |
|---|---|---|---|---|---|---|---|---|---|
| 0.0000 | 4.71 | 75.1905 | 353.9 | 0.000 | | 499.99974 | 2155.8193 | 0.0000 | 0.00000 |
| 22.6186 | 5.11 | 75.3970 | 383.6 | 29.724 | 0.02179 | 499.99992 | 2155.8196 | −0.0002 | 0.11860 |
| 45.1704 | 5.50 | 75.6040 | 413.3 | 59.441 | 0.03748 | 500.00000 | 2155.8195 | −0.0001 | 0.17110 |
| 67.6558 | 5.89 | 75.8110 | 443.0 | 89.152 | 0.04611 | 499.99997 | 2155.8193 | 0.0001 | 0.15580 |
| 90.0760 | 6.28 | 76.0160 | 472.7 | 118.857 | 0.04909 | 499.99985 | 2155.8197 | −0.0003 | 0.07600 |
| 112.4860 | 6.68 | 75.8430 | 502.4 | 148.555 | 0.04636 | 499.99995 | 2155.8193 | 0.0001 | −0.01400 |
| 334.9432 | 7.07 | 75.6680 | 532.1 | 178.248 | 0.03722 | 500.00000 | 2155.8194 | −0.0001 | −0.05680 |
| 157.4478 | 7.46 | 75.4920 | 561.8 | 207.934 | 0.02219 | 499.99999 | 2155.8195 | −0.0001 | −0.05220 |
| 180.0000 | 7.85 | 75.3175 | 591.5 | 237.614 | −0.00002 | 499.99994 | 2155.8195 | −0.0002 | 0.00000 |
| 202.5614 | 8.25 | 75.3980 | 621.2 | 267.288 | 0.02162 | 499.99998 | 2155.8195 | −0.0001 | 0.06140 |
| 225.0944 | 8.64 | 75.4760 | 650.8 | 296.955 | 0.03744 | 500.00000 | 2155.8195 | −0.0001 | 0.09440 |
| 247.5992 | 9.03 | 75.5550 | 680.5 | 326.617 | 0.14648 | 500.00000 | 2155.8194 | −0.0001 | 0.09920 |
| 270.0757 | 9.43 | 75.6350 | 710.1 | 356.272 | 0.04974 | 499.99998 | 2155.8194 | −0.0001 | 0.07568 |
| 292.5428 | 9.82 | 75.5860 | 739.8 | 385.921 | 0.04596 | 499.99999 | 2155.8194 | 0.0000 | 0.04281 |
| 315.0194 | 10.21 | 75.5400 | 769.4 | 415.563 | 0.03748 | 500.00000 | 2155.8195 | −0.0001 | 0.01939 |
| 337.5048 | 10.60 | 75.4940 | 799.1 | 445.199 | 0.02226 | 500.00000 | 2155.8194 | 0.0000 | 0.010480 |
| 360.0000 | 11.00 | 75.4445 | 828.7 | 474.830 | −0.00015 | 500.00000 | 2155.8196 | −0.0003 | 0.00000 |
| 382.4670 | 11.39 | 75.6500 | 858.3 | 504.454 | −0.17830 | 499.99995 | 2155.8195 | −0.0002 | −0.03300 |
| 404.8683 | 11.73 | 75.2550 | 887.9 | 534.071 | −0.36228 | 499.99980 | 2155.8196 | −0.0003 | −0.13170 |
| 427.2043 | 12.17 | 76.0610 | 917.6 | 563.684 | −0.55305 | 499.99956 | 2155.8203 | −0.0010 | −0.29570 |
| 449.4757 | 12.56 | 76.2650 | 947.2 | 593.291 | −0.74845 | 499.99922 | 2155.8217 | −0.0023 | −0.52430 |
| 471.7349 | 12.95 | 76.1030 | 976.8 | 622.890 | −0.95103 | 499.99946 | 2155.8221 | −0.0028 | −0.76510 |
| 494.0400 | 13.34 | 75.9290 | 1006.4 | 652.480 | −1.19943 | 499.99966 | 2155.8201 | −0.0008 | −0.96000 |
| 516.3916 | 13.73 | 75.7540 | 1035.9 | 682.064 | −1.37409 | 499.99982 | 2155.8175 | 0.0018 | −1.10840 |
| 538.7899 | 14.12 | 75.5810 | 1065.5 | 711.641 | −1.59609 | 499.99993 | 2155.8145 | 0.0048 | −1.21010 |

The upper band transmission data shown in Tables 2A and 2B provides an example representation of the number of actual rotations of the driven cam pulley as a result of the rotations of the driver spiral pulley. As shown in Tables 2A and 2B, the angular displacement of both the driver spiral pulley and the driven cam pulley is the same at 0°, 180° and 360°. As the belt unwraps from the spiral pulley, from 0° to 540°, the radius decreases linearly as will be discussed in more detail with respect to FIG. 4. The radius of the belt about the cam pulley correspondingly increases in a non-linear manner as will be discussed in more detail below with respect to FIG. 4.

FIGS. 3A and 3B show belt wrapping diagrams for a spiral-cam pulley assembly as shown in FIG. 2D. Band 306 wraps around spiral pulley 302 and cam pulley 307. As shown in FIG. 3A, band 306 is completely wound around the spiral pulley 302 and completely unwound from the cam pulley 307. The end of band 306 is attached to the spiral pulley 302 at 90° and the other end of band 306 is attached to the cam pulley 307 at 270°. As shown in FIG. 3B, when band 306 is halfway unwound from spiral pulley 302 and halfway wound around cam pulley 307, the attachment of band 306 to spiral pulley 302 is at 90° and the attachment of band 306 to cam pulley 307 is at 270°. Spiral pulley 302 and cam pulley 307 are positioned on an upper portion of each pulley assembly.

FIGS. 3C and 3D show further wrapping diagrams for the pulley assemblies as shown in FIG. 2D. Band 308 wraps around spiral pulley 305 and cam pulley 309. As shown in FIG. 3C, band 308 is completely unwound from cam pulley 309 and completely wound around spiral pulley 305. The end of band 308 is attached to cam pulley 309 at 90° and the other end of band 308 is attached to spiral pulley 305 at 270°. As shown in FIG. 3D, when band 308 is halfway wound around cam pulley 309 and halfway unwound around spiral pulley 305 the attachment of band 308 to cam pulley 309 is at 90° and the attachment of band 308 to spiral pulley 305 is at 270°. Cam pulley 309 and spiral pulley 305 can be positioned on a lower portion of each pulley assembly (e.g., beneath the pulley system shown in FIGS. 3A and 3B).

FIG. 4 shows a comparison between the spiral and cam pulleys of a pulley system as shown in FIG. 2D. Line 414 shows the radius from the center of a spiral pulley to the outside surface of a band when unwrapping in comparison to line 416, which shows the radius from the center of a cam pulley to the outside surface of a band when wrapping. As shown in FIG. 4, the radius of the band around a spiral pulley during wrapping and unwrapping can be represented by a linear fit curve. As shown by line 414, the radius of the band changes in a decreasing linear relationship as it unwinds from the spiral pulley. During wrapping, the radius of the band around the spiral pulley would increase linearly.

In contrast, as shown by line 416, the radius of the cam pulley varies as the band winds about the cam pulley. As shown in FIG. 4, the radius of the belt around the cam pulley 416 nonlinearly increases to keep the difference in angular rotation between the cam and spiral pullies (or belt stress) as small as possible from 0° to 360°. The cam pulley radius profile 416 generally increases with wrapping and can be considered cyclic. For example, from 0° to 360° the curve 416 has two peaks, which are repeated again from 360° to 720°, but shifted upward due to the increase in radius. The cyclic radius profile for the cam pulley would continue to repeat and increase with every wrap of the band around the pulley and onto itself.

Figure 5B:
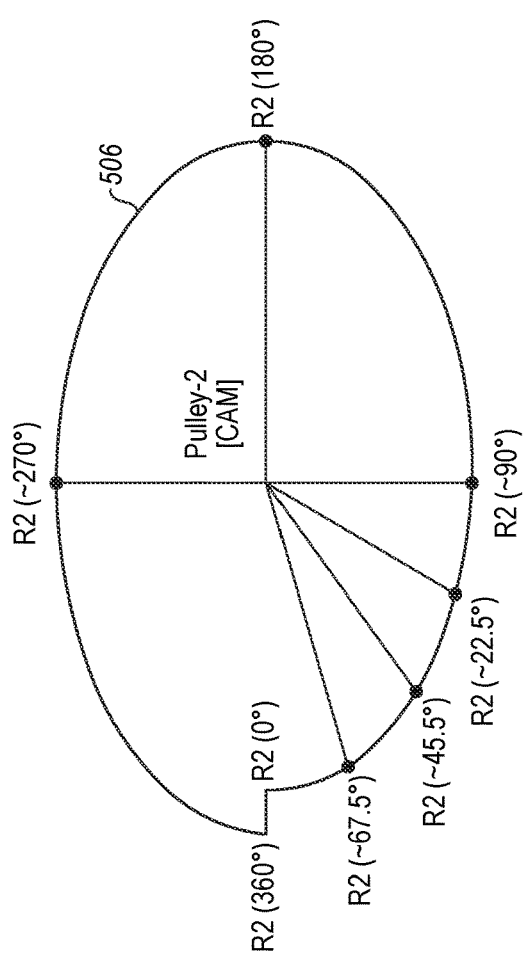
FIG. 5B shows the upper band transmission profile of an embodiment of a (driven) cam pulley of a spiral-cam pulley assembly of a multi-turn assembly according to embodiments.
Figure 5A:
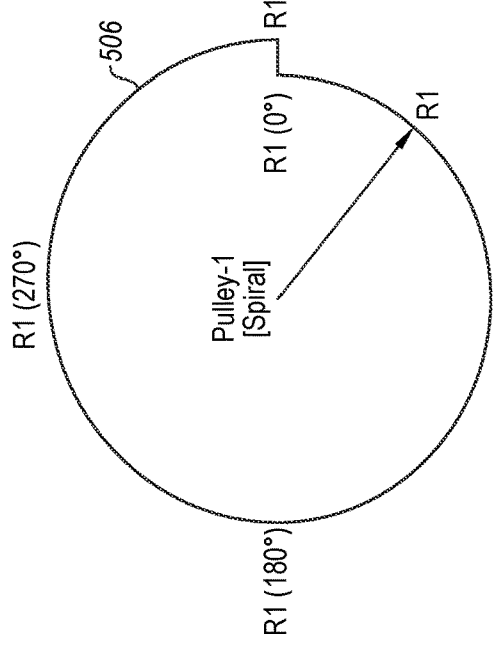
FIG. 5A shows the upper band transmission profile of an embodiment of a (driver) spiral pulley of a spiral-cam pulley assembly of a multi-turn assembly according to embodiments.

FIG. 5A shows the upper band radius profile of an embodiment of a spiral pulley of a spiral-cam pulley assembly according to embodiments. FIG. 5A shows one wrap (R1) of band 506 around a spiral pulley. Band 506 is attached to the pulley at 0° and the radius linearly increases from 0° to 360°. The belt thickness and belt wrap length can be determined as follows for the spiral pulley:

$$Rf - Ri = t = \text{Belt Thickness}$$

$$R1 = R1i + \left(\frac{\theta}{2\cdot\pi}\right)t$$

$$\int\left[R1i + \left(\frac{\theta 1}{2\cdot\pi}\right)\cdot t\right]d\theta 1 = \text{Belt Wrap Length}$$

The above values are used to determine the belt wrap length on the spiral (S1) and cam (S2) to solve for the cam profile (R, θ).

FIG. 5B shows the upper band radius profile of an embodiment of a cam pulley of a spiral-cam pulley assembly according to embodiments. FIG. 5B shows one wrap (R1) of band 506 around the cam pulley. As shown in FIG. 5B, band 506 is attached to the cam pulley at 0°. As the band 506 wraps around the cam pulley, the radius changes. For example, at 0° the radius may have a first value, $r_1$, at 90° the radius may have a second value, $r_2$, at 180° the radius may have a third value, $r_3$ (which could be the same as $r_1$), at 270° the radius can have a fourth value, $r_4$ (which could be the same as $r_2$) and at 360° the radius can have a fifth value, $r_5$, as band 506 begins to wrap on itself. According to embodiments, the Cam Radius and angular position can meet the following criteria: Spiral Pulley Rotates 0°→180° and Cam Pulley Rotates 0°→180°; Spiral Pulley Rotates 180°→360° and Cam Pulley Rotates 180°→360°; in-between 0°, 180°, 360°, >360°, the Cam Pulley Rotation does not equal the Spiral Pulley Rotation.

The transmission profiles of spiral-spiral pulley assemblies including a torsion spring are shown in FIG. 6A. The change in rotation of the driven pulley compared to the driver pulley in degrees is plotted as a function of the rotations of the driver pulley in degrees. The chart shows the belt transmissions 602, 604 for the corresponding two spiral-spiral pulley assemblies including the input-output relationship and the relative motions. The difference between the spiral-spiral pulley rotations diverge—one gets larger and the other gets smaller.

Figure 6B:
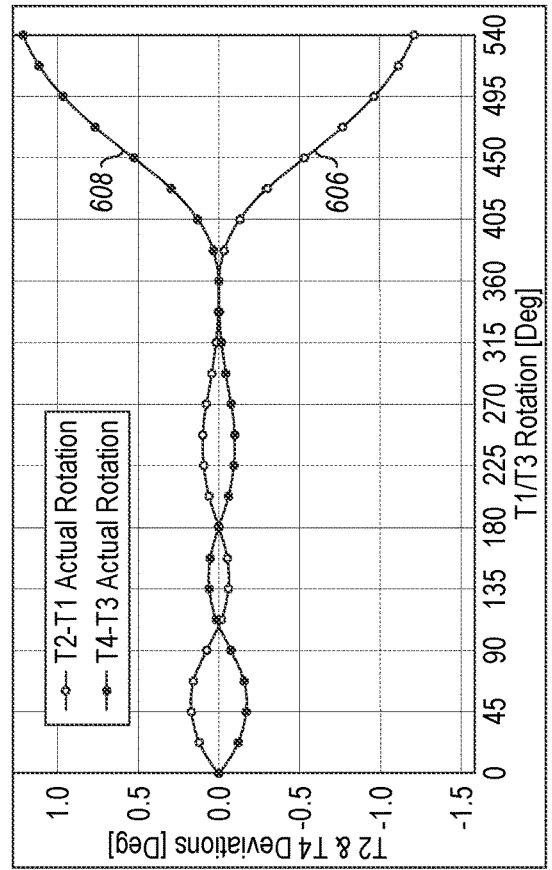
FIG. 6B depicts the rotation profile of a spiral-cam pulley assembly of a multi-turn drive assembly according to various embodiments.
Figure 6A:
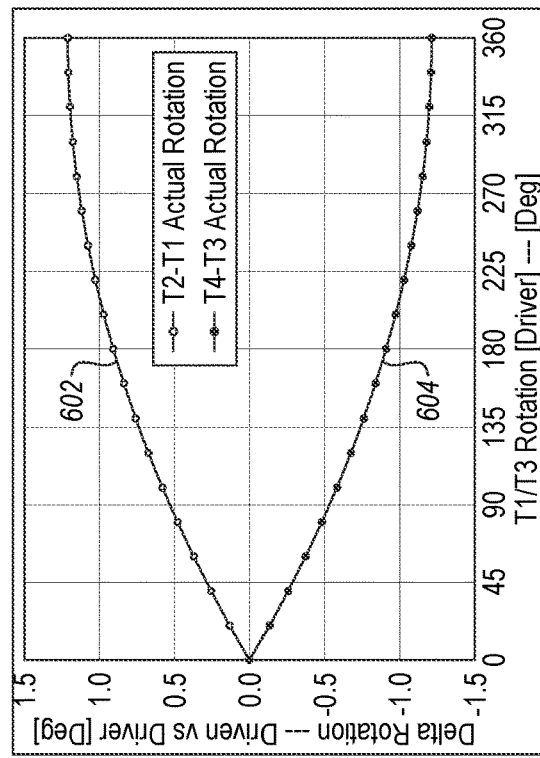
FIG. 6A depicts the rotation profiles of spiral-spiral pulley assemblies having a torsion spring in each pulley component according to embodiments.

The transmission profiles of a spiral-cam pulley system is shown in FIG. 6B. The change in rotation of the driven (cam) pulley compared to the driver (spiral) pulley in degrees is plotted as a function of the rotations of the driver pulley in degrees as represented by lines 606, 608 for each spiral-cam pulley assembly. As shown in FIG. 6B, for the spiral-cam pulley assemblies, the cam profile has been shaped and optimized to keep the total difference between the actual rotations of the spiral pulley and the cam pulley within a particular range (e.g., ±0.1° to ±1.5°, or ±0.3° to ±1.3°, or ±0.5° to ±1.0°). As shown in FIG. 6B, the delta rotation of both spiral-cam pulley assemblies oscillates about 0° until 360° and then does not modulate further; rather, it just follows the interpolated shape and increases. The use of a cam pulley in a pulley assembly according to embodiments herein, enables the cyclical undulations shown in FIG. 6B that keeps the delta rotation close to 0° for one rotation and then beyond one rotation (360°+) the delta rotation changes until it reaches some upper limit based on band stress.

FIG. 6C shows a stress plot of the belt in a spiral-cam pulley assembly. The bending stress arises when the belt wraps around the pulley and varies slightly due small change in cam profile radius. The working load stress is stress due to torque transmission and also has minor variation due to the cam profile radius variation. As shown in FIG. 6C, the bending stress 606 remains constant during the pulley rotation (in degrees). The working load stress 608 also remains constant during the pulley rotation (in degrees). The pretension with belt stretch stress 610 was largely constant from 0° to about 400° rotation at which point it began to increase until 540° rotation. The total stress 612 on the band also remained constant until about 400° rotation when it began to increase.

Drive assemblies as described herein can be used in robots having a link member rotatable about an axis (e.g., a shoulder axis, a wrist axis, etc.). The following embodiments will be described in the context of a robot arm for a semiconductor processing chamber. Those of ordinary skill in the art will recognize and understand that the multi-turn drive assemblies are useful for pulley systems used for rotating a member (e.g., an arm link) a maximum of at least 360 degrees about an axis of rotation.

With reference to FIG. 7A and FIG. 7B, according to embodiments, described herein is a robot 700, comprising an arm 702 rotatable about a shoulder axis 704. The arm 702 can be connected to a motor (not shown) via a shaft (not shown) that causes independent rotation of the arm 702. The robot 700 can further include a forearm 706 rotatable relative to the arm 702 about a forearm axis 708 at a position offset from the shoulder axis 704. According to embodiments, the forearm 706 can have a maximum rotation of at least 360 degrees about the forearm axis 708. It should be noted, that in certain embodiments, the forearm 706, like the arm 702, can be connected to a motor (not shown) via a shaft (not shown) that causes independent rotation of the forearm 706. In further embodiments, the robot 700 can include a forearm drive assembly for rotating the forearm 706 about the forearm axis 708. The forearm drive assembly can include a forearm driving member (e.g., a spiral pulley) and a forearm driven member (e.g., a spiral or cam pulley) attached to the forearm 706 as in FIG. 1A and FIG. 1B (see 100, 102, 104). In FIG. 7B, the robot 700 is shown in a resting, non-extended position.

The forearm drive assembly of robot 700 can further include a forearm transmission element comprising a first band, as in FIG. 1A and FIG. 1B (see 106), wherein a first end of the first band is affixed to the forearm driving member and a second end of the first band is affixed to the forearm driven member. According to embodiments, the first band 106 wraps at least two times around the forearm driving member, as shown in FIG. 1A and FIG. 1B (see 102), when the forearm is in a first forearm position. In embodiments, the first band wraps about 2 to about 10 times around the forearm driving member when the forearm is in the first forearm position, wherein the maximum rotation about the forearm axis is at least 360 degrees, or at least 720 degrees, or at least 1080 degrees, and so forth.

The forearm transmission element can further include a second band, as in FIG. 1A and FIG. 1B (see 108), wherein a first end of the second band is affixed to the forearm driving member and a second end of the second band is affixed to the forearm driven member. In embodiments, the second band wraps at least two times around the forearm driven member when the forearm is in the first position. According to embodiments, the first band can be wrapped around the forearm driving member in a first direction (e.g., clockwise or counterclockwise) and the second band can be wrapped around the forearm driving member in an opposite second direction (e.g., counterclockwise or clockwise) as shown in FIG. 1A and FIG. 1B. According to embodiments, the first band can wrap at least two times around the forearm driven member, as shown in FIG. 1A and FIG. 1B (see 102), when the forearm is in a second forearm position.

In certain embodiments, at least one of a shape or a radius of the forearm transmission element on the forearm driving member changes with rotations of the forearm about the forearm axis. As described above, as the first band 106 or second band 108 wraps upon itself, the radius from the center of the driving member 102 or the driven member 107 to a fixed position on the outer cylinder surface can increase (wrapping) or decrease (unwrapping). Additionally, because of an imperfect spiral pattern in come embodiments, the shape of the band 106, 108 around the cylinder surface 102, 104 can also change. In embodiments, rotations of the forearm in a first direction causes the first band to wind around the forearm driving member and further causes the radius of the forearm driving member to increase. Similarly, rotations of the forearm in an opposite second direction causes the first band to unwind from the forearm driving member and further causes the radius of the forearm driving member to decrease.

According to various embodiments, the forearm drive assembly can further include a first tensioner element. The first band may be affixed to the forearm driving member via the first tensioner element. The forearm drive assembly can further include a second tensioner element, wherein the first band is affixed to the forearm driven member via the second tensioner element. According to embodiments, the first tensioner element and the second tensioner element are jointly operable to control tension in the first band and to control a phase of the forearm driven member to the forearm driving member.

In further embodiments, the forearm drive assembly can further include a third tensioner element, wherein the second band is affixed to the forearm driving member via the third tensioner element, and a fourth tensioner element, wherein the second band is affixed to the forearm driven member via the fourth tensioner element. In embodiments, the third tensioner element and the fourth tensioner element are jointly operable to control tension in the second band and to control a phase of the forearm driven member to the forearm driving member.

With further reference to FIGS. 7A and 7B, the robot 700 can include a first wrist member 710 (e.g., an end effector) rotatable relative to the forearm 706 about a wrist axis 712 at a position offset from the shoulder axis 708. The first wrist member 710 can have a maximum rotation of at least 360 degrees about the wrist axis 712. The first wrist member can include a first wrist drive assembly, as in FIG. 1A and FIG. 1B (see 100), for rotating the first wrist member 710 about the wrist axis 712. The first wrist drive assembly can include a first wrist driving member and a first wrist driven member, as shown in FIG. 1A and FIG. 1B (see 102, 104), attached to the first wrist member. The first wrist drive assembly can further include a first wrist transmission element including a first band, as shown in FIG. 1A and FIG. 1B (see 106), wherein a first end of the first band is affixed to the first wrist driving member and a second end of the first band is affixed to the first wrist driven member. According to embodiments, the first band can wrap at least two times around the first wrist driving member when the first wrist is in a first wrist position.

In further embodiments, the first wrist transmission element can include a second band, as in FIG. 1A and FIG. 1B (see 108), wherein a first end of the second band is affixed to the first wrist driving member and a second end of the second band is affixed to the first wrist driven member. In embodiments, the second band can wrap at least two times around the first wrist driven member when the first wrist is in the first position. According to embodiments, the first band can be wrapped around the first wrist driving member in a first direction while the second band is wrapped around the first wrist driving member in an opposite second direction. In embodiments, the robot 700 can include a first end effector 714 attached to the first wrist member 710.

According to various embodiments, the first wrist drive assembly can further include a first tensioner element, as in FIG. 1E (see 110), wherein the first band of the first wrist transmission element is affixed to the first wrist driving member via the first tensioner element. In embodiments, the first wrist drive assembly can include a second tensioner element, wherein the first band of the first wrist transmission element is affixed to the first wrist driven member via the second tensioner element. According to various embodiments, the first tensioner element and the second tensioner element are jointly operable to control tension in the first band and to control a phase of the first wrist driven member to the first wrist driving member. In embodiments, the first wrist drive assembly can further include a third tensioner element, wherein the second band of the first wrist transmission element is affixed to the first wrist driving member via the third tensioner element. The first wrist transmission element can further include a fourth tensioner element, wherein the second band of the first wrist transmission element is affixed to the first wrist driven member via the fourth tensioner element. In embodiments, the third tensioner element and the fourth tensioner element are jointly operable to control tension in the second band and to control a phase of the first wrist driven member to the first wrist driving member.

In yet further embodiments, the robot 700 can include a second wrist member 716 rotatable relative to the forearm about the wrist axis 712 at a position offset from the shoulder axis 708, wherein the second wrist member 716 has a maximum rotation of at least 360 degrees about the wrist axis 712. In embodiments, the robot can include a second end effector 718 attached to the second wrist member 716.

The robot 700 can further include a second wrist drive assembly, as in FIG. 1A and FIG. 1B (see 100), for rotating the second wrist member 716 about the wrist axis 712. The second wrist member 716 and the second wrist drive assembly can be positioned below (shown) or above the first wrist member 710 and the first wrist drive assembly. The second wrist drive assembly can include a second wrist driving member and a second wrist driven member attached to the second wrist member 716. The second wrist drive assembly can further include a second wrist transmission element including a first band, as shown in FIG. 1A and FIG. 1B (see 106), wherein a first end of the first band is affixed to the second wrist driving member and a second end of the first band is affixed to the second wrist driven member. In embodiments, the first band can wrap at least two times around the second wrist driving member when the second wrist member is in a second wrist position. The second wrist transmission element can further include a second band, wherein a first end of the second band is affixed to the second wrist driving member and a second end of the second band is affixed to the second wrist driven member. According to embodiments, the second band can wrap at least two times around the second wrist driven member when the second wrist is in the first position. In embodiments, the first band is wrapped around the second wrist driving member in a first direction and the second band of the first wrist transmission element is wrapped around the second wrist driving member in an opposite second direction.

In embodiments, the second wrist drive assembly can further include a first tensioner element, wherein the first band of the second wrist transmission element is affixed to the second wrist driving member via the first tensioner element. In further embodiments, the second wrist drive assembly can include a second tensioner element, wherein the first band of the second wrist transmission element is affixed to the second wrist driven member via the second tensioner element. In various embodiments, the first tensioner element and the second tensioner element are jointly operable to control tension in the first band of the second wrist transmission element and to control a phase of the second wrist driven member to the second wrist driving member.

In yet further embodiments, the second wrist drive assembly includes a third tensioner element, wherein the second band of the second wrist transmission element is affixed to the second wrist driving member via the third tensioner element. Also included can be a fourth tensioner element, wherein the second band of the second wrist transmission element is affixed to the second wrist driven member via the fourth tensioner element. According to various embodiments, the third tensioner element and the fourth tensioner element are jointly operable to control tension in the second band of the second wrist transmission element and to control a phase of the first wrist driven member to the first wrist driving member.

With further reference to FIG. 7A and FIG. 7B, one or more drive assemblies as described herein may be operable to rotate links of a robot arm 700 as used in a transfer chamber (not shown) of an electronic device processing system. The transfer chamber may be under ultra-high vacuum and any electrical components, for example, motors operable to rotate the arm 702 and, if so configured, forearm 706 of the robot 700, may be located on an atmospheric side of the transfer chamber. The transfer chamber may have an elongated, rectangular, high aspect ratio (e.g., ratio of length to width of about 10:1) and/or linear mainframe configuration where process chambers and/or load lock chambers, collectively, are positioned and accessible by the robot arm 700 on all sides of the transfer chamber.

The electronic device processing system can include the transfer chamber and a robot 700 at least partially disposed in the transfer chamber and adapted to transport substrates (not shown) to and from process chambers coupled to the transfer chamber (e.g., underneath). The robot can be configured as described above.

As shown in FIGS. 7A and 7B, each wrist member 710, 716 can have a substrate (not shown) received thereon, respectively. It should be noted that the robot can include third, fourth, fifth, etc. wrist members as described above. Forearm member 708 can be rotated inward toward the arm axis thus withdrawing substrate out of the chamber. Wrist member 710 may then be rotated clockwise while wrist member 716 is similarly rotated clockwise. Substrate may then be positioned in the same process chamber and substrate may then be positioned in another chamber. The entire substrate swap has occurred by avoiding wafer-over-wafer or arm-over-wafer positioning. Additionally, when wrist member 716 is drawn from the process chamber, i.e., empty, without a substrate, it can further rotate clockwise while wrist member 710 is positioned into another chamber, for example, the chamber adjacent to the chamber from which wrist member 716 just withdrew. The multi-turn drive assemblies thus enable the robot arms to move in complex ways that not only avoids wafer-over-wafer and arm-over-wafer positioning, but also increases wafer throughput.

Figure 8A:
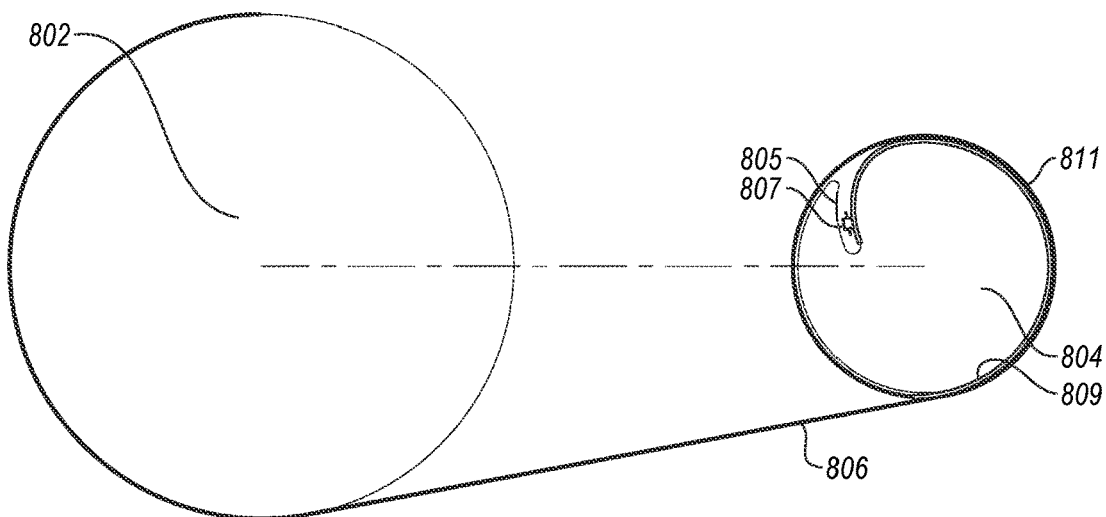
FIG. 8A shows an attachment means for a band of a multi-turn drive assembly according to embodiments.

In one embodiment, as shown in FIG. 8A, there can be a machined interior cavity 805 in the driving member or the driven member with a spiral transition curve profile for smooth change in radius and minimized belt stress. For example, in one embodiment, one end of the band 806 can be attached to the driven member 804 in an interior cavity 805 via an attachment means 807 such as a screw, pin, nail, and the like. In embodiments, the attachment means can be a tensioner element. The driving member 802 and/or driven member 804 may have a perfectly circular cross section (e.g., in a spiral pulley), or may have a cross section that is not a perfect circle (e.g., a cam pulley or non-spiral pulley). For example, a first side of the interior cavity 805 may have a radius that is greater than a radius at a second side of the interior cavity 805 by a thickness of the band 806. This may enable the band to achieve a spiral (e.g., a perfect spiral) as it wraps around the driving member and/or driven member. In some embodiments, the interior cavity is omitted, but the driving member 802 and/or driven member 804 includes a step at the transition point at which the band begins to wrap around itself. The step may have a height that is approximately equal to a thickness of the band. Accordingly, this may achieve the spiral configuration, and may eliminate stress points in the band 806.

According to further embodiments, to obtain a more perfect spiral, there can be a radius transition spiral profile on a machined block (i.e., belt tab] welded to belt. In yet further embodiments, the pulley can be profiled earlier so that the radius transition is not as abrupt. In yet further embodiments, there is "tuck-in the belt" fastening/tensioning inside the pulley, which incorporates a spiral profile on the pulley/insert. In other embodiments, there may be a spiral transition curve, that is, a smooth change in radius.

According to embodiments, as shown in FIG. 8A, when the band 806 forms a second wrap 811 upon the first wrap 809, a more perfect spiral can be created through the use of an interior cavity 805 wherein the band can be attached to the pulley via an attachment element 807 (e.g., pin, screw, etc.). In this embodiment, the stress point at the point where the band wraps upon the end can be reduced or eliminated. Controlling the tension and phasing of the band 806 as it winds and unwinds about the driving member 802 and the driven member 804 can account for friction forces that result from the band 806 wrapping upon itself.

Figure 8B:
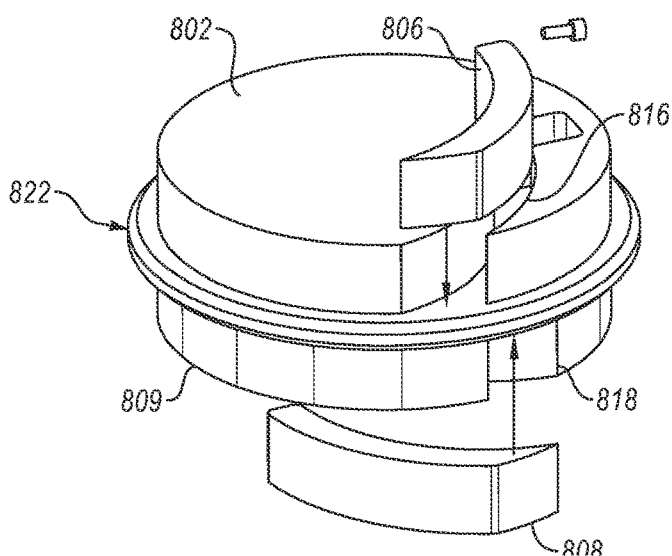
FIG. 8B shows a perspective view of an attachment means configuration of a band of a multi-turn drive assembly according to embodiments.
Figure 8C:
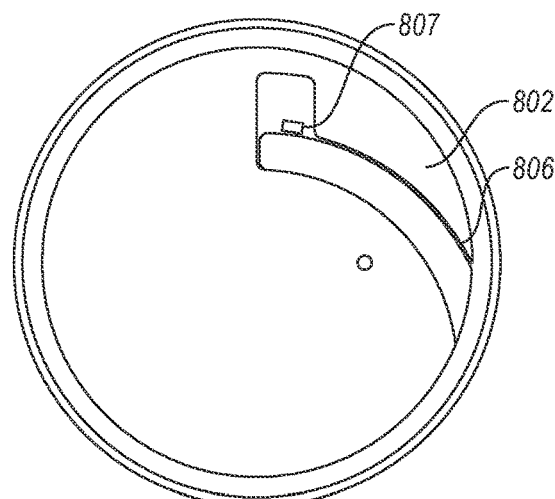
FIG. 8C shows a top view of an attachment means of a band of a multi-turn drive assembly according to embodiments.

FIGS. 8B and 8C show another embodiment for attaching each band 806, 808 to spiral pulley 802 and cam pulley 809 of a spiral-cam pulley component 822. The end of each band 806, 808 can be received in interior cavity 816, 818 and attached to the pulley 802, 809 via an attachment element (e.g., a pin, screw, etc.). Because of this configuration, when the band 806, 808 forms a second wrap the point where it crosses over itself is smooth, rather than abrupt. This helps reduce or eliminate a stress point.

Figure 9A:
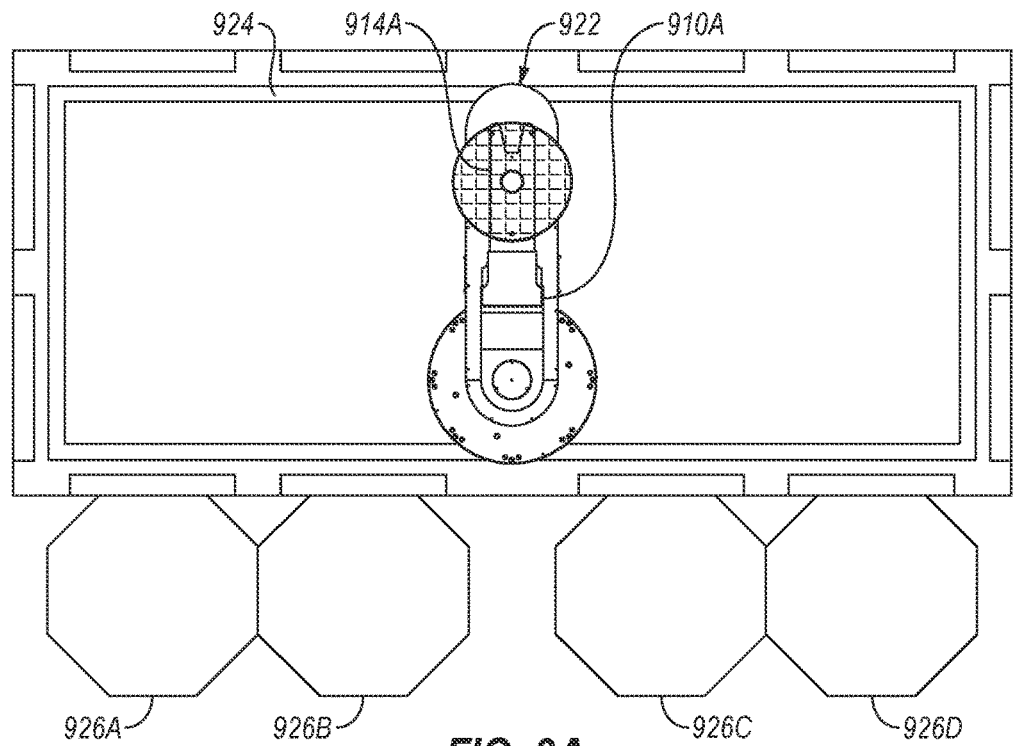
FIG. 9A depicts a top view of a substrate transfer system having a robot arm therein according to various embodiments.
Figure 9B:
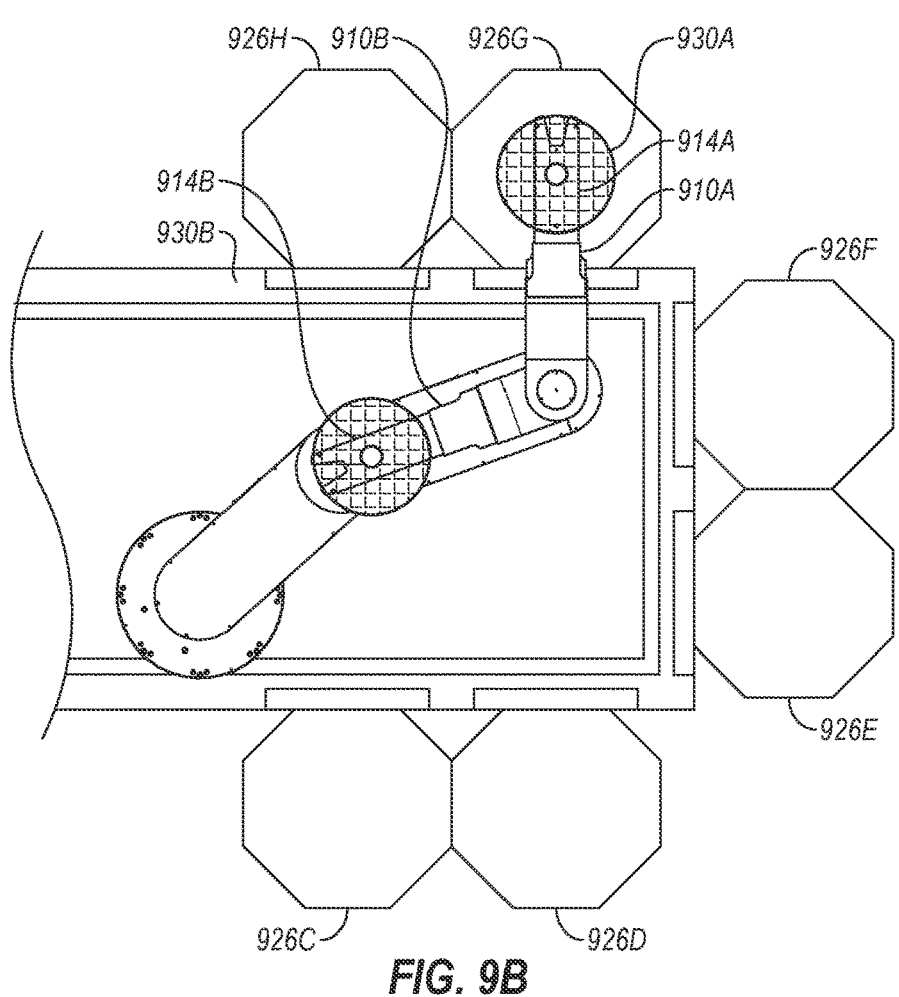
FIG. 9B depicts a top view of a substrate transfer system having a robot arm therein according to various embodiments.

FIGS. 9A-9B show a transfer chamber having a robot with a multi-turn drive assembly according to embodiments described herein. In FIG. 9A, the robot 922 is shown in a non-extended position within a transfer chamber 924. The transfer chamber 924 can have a linear configuration as shown or can be in any configuration suitable for semiconductor processing and known to those of ordinary skill in the art (e.g., a cluster configuration). The transfer chamber 924 can be connected to at least one process chamber 926A-H, and the robot 922, which contains at least one end effector 914A, 914B movable via a multi-turn drive assembly as described according to embodiments herein. In FIG. 9B, the robot is shown extended into process chamber 926G to place a substrate 930A via wrist member 910A and end effector 914A. Also shown, is a substrate 930B resting on end effector 914B connected to wrist member 910B; the substrate is waiting to be placed into the same or a different process chamber 926A-G. According to embodiments, the multi-turn drive assemblies can enable each wrist member 910A, 910B to rotate more than 360°, or more than 450°, or more than 540° such that, for example, after placing substrate 930A on a support in process chamber 926G, the wrist member can rotate 270° in a counter-clockwise direction to retrieve a substrate (not shown) from process chamber 926E.

Figure 10A:
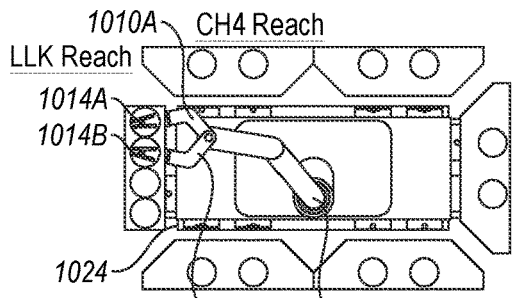
FIG. 10A depicts a top view of a substrate transfer system having a robot arm therein according to various embodiments.
Figure 10B:
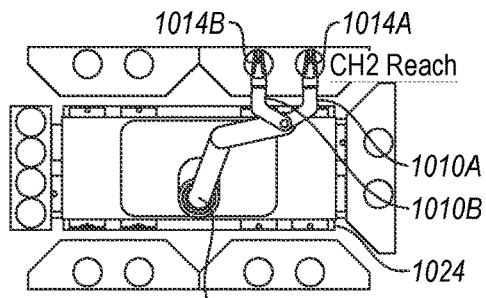
FIG. 10B depicts a top view of a substrate transfer system having a robot arm therein according to various embodiments.
Figure 10C:
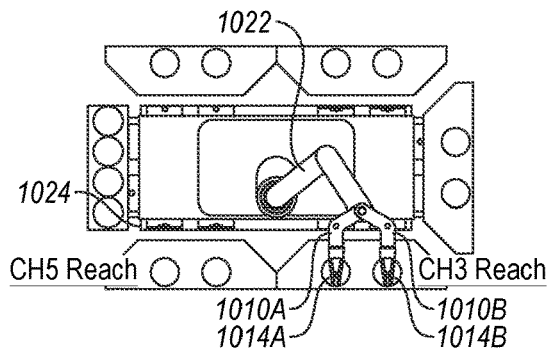
FIG. 10C depicts a top view of a substrate transfer system having a robot arm therein according to various embodiments.
Figure 10D:
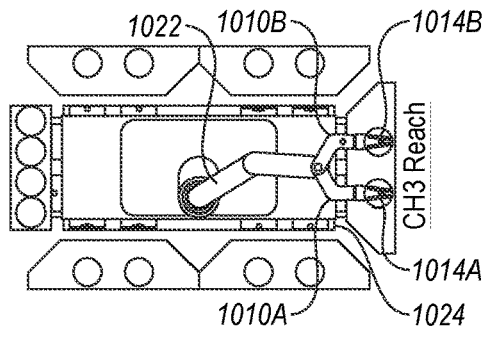
FIG. 10D depicts a top view of a substrate transfer system having a robot arm therein according to various embodiments.

Another embodiment shown in FIGS. 10A-10D includes a transfer chamber 1024 having a robot 1022 operable by a multi-turn drive assembly according to embodiments described herein. As shown in FIG. 10A, the robot 1022 can include two wrist members 1010A, 1010B, each having a corresponding end effector 1014A, 1014B. In this embodiment, the multi-turn drive assembly is configured to rotate both wrist members 1010A, 1010B simultaneously such that both end effectors 1014A, 1014B can enter two adjacent process chambers at the same time as shown in FIGS. 10A-10D. FIGS. 10A to 10D shows robot postures when they accesses different chambers and corresponding driven pulley angular positions in FIGS. 11A and 11B (discussed below). Having full 360° wrist pulley rotation, provides the flexibility needed to reach any chamber location intermediate.

Figure 11A:
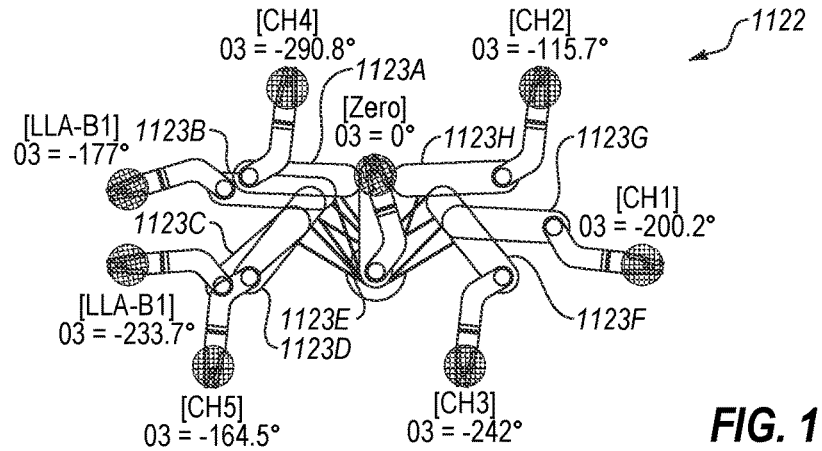
FIG. 11A depicts a top view of a substrate transfer system having a robot arm therein according to various embodiments.
Figure 11B:
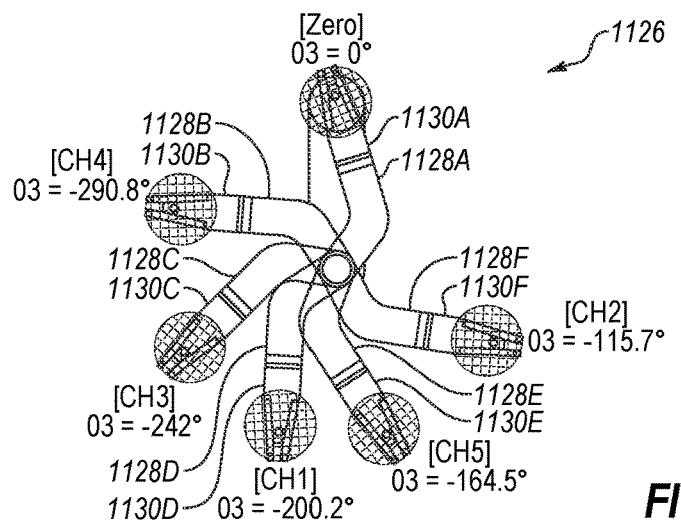
FIG. 11B depicts a top view of a substrate transfer system having a robot arm therein according to various embodiments.

In yet further embodiments, as shown in FIG. 11A, a transfer chamber can include a robot 1122 having multiple robot arms 1123A-H operable by at least one multi-turn drive assembly according to embodiments described herein. According to embodiments, each robot arm 1123A-H can be operable by a corresponding multi-turn drive assembly according to embodiments herein. In further embodiments, as shown in FIG. 11B, a robot 1126 can include multiple wrist members 1128A-F such that each wrist member is operable by at least one multi-turn drive assembly according to embodiments herein. The wrist members 1128A-F can have corresponding end effectors 1130A-F. FIGS. 11A and 11B illustrate having >360° rotation at the robot wrist joint which provides the flexibility needed to reach a wider range of (x,y) locations related to chamber positions than traditional pulley systems.

Figure 12:
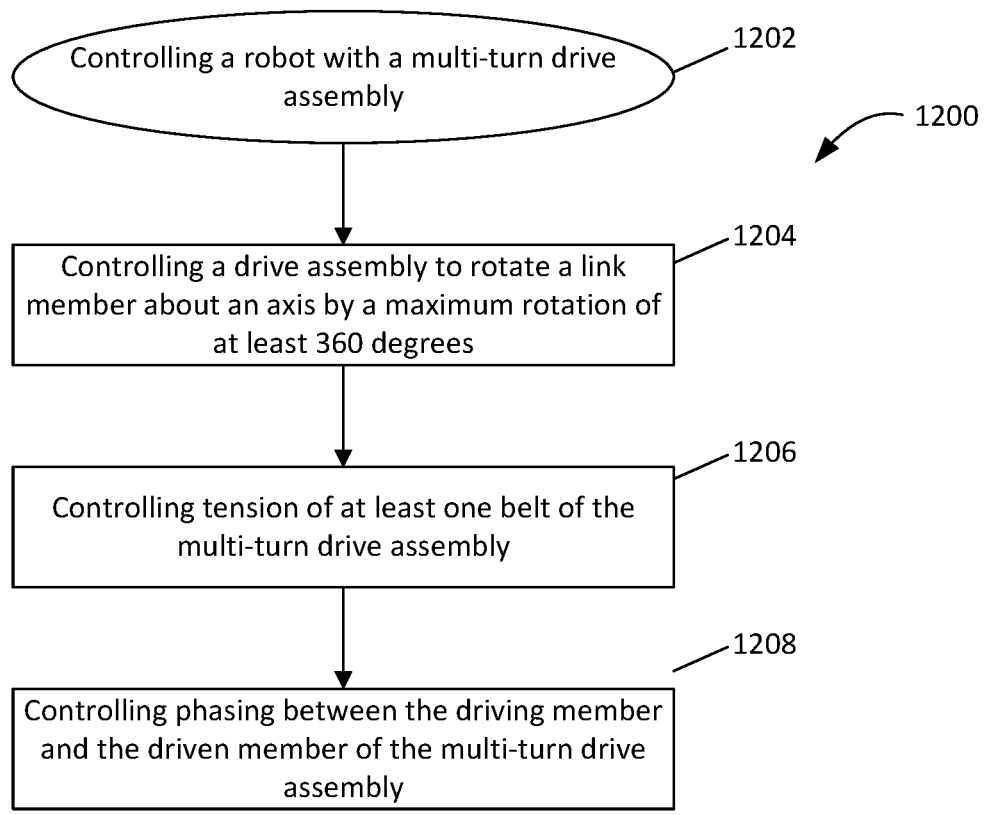
FIG. 12 illustrates a method of controlling a multi-turn drive assembly according to various embodiments.

The blacked out region 40° (360°-320°) is the deadzone that wrist cannot go in conventional/current design and has to placed in 360° zone in such a way that it does not prevent any of the Chamber access locations Further disclosed herein are methods of controlling a robot. The robot can include a drive assembly with a multi-turn band transmission, according to the various embodiments described herein. With reference to FIG. 12, in embodiments, the method 1200 involves controlling a robot having a multi-turn drive assembly according to embodiments described herein. For example, in embodiments, the robot can include an arm rotatable about a shoulder axis, a forearm rotatable relative to the arm about a forearm axis at a position offset from the shoulder axis, a first wrist member rotatable relative to the forearm about a wrist axis at a position offset from the shoulder axis, wherein the first wrist member has a maximum rotation of at least 360 degrees about the wrist axis, and a first wrist drive assembly for rotating the first wrist member about the wrist axis. The first wrist drive assembly can include a first wrist driving member, a first wrist driven member attached to the first wrist member, and a first wrist transmission element according to embodiments herein.

In embodiments, the first wrist drive assembly can have a non-linear transmission ratio between the first wrist driven member and the first wrist driving member, wherein the non-linear transmission ratio is based on a first number of wrappings of the first band about the first wrist driving member and a second number of wrappings of the first band about the first wrist driven member. The non-linear transmission ratio can be calculated by taking a ratio between the driven member cam profile radius to driving member spiral profile radius for each of the commanded driving member angular positions. According to embodiments, the robot includes a controller configured to drive the first wrist member drive assembly. The controller can include a control algorithm that mathematically defines the non-linear transmission ratio. For example, the constantly changing transmission ratio can be fed into an algorithm (e.g., kinematic calculations) to determine the end-effector location.

In embodiments, method 1200 further includes at block 1204, controlling the drive assembly to rotate a link member about an axis by a maximum rotation of at least 360 degrees. The link member can be, for example, a forearm or a wrist member. The robot can include multiple drive assemblies, one for each of the forearm, a first wrist member, a second wrist member, a third wrist member and so on. For example, the controller may receive a signal from a process chamber indicating that a substrate has completed its processing steps and that the process chamber is ready for a new substrate. The controller then sends a signal to the robot to remove the substrate from the process chamber and to replace the substrate with a new substrate that requires processing. The robot may activate the drive assembly for the arm member, and/or the drive assembly for the forearm member, and/or the drive assembly for the first wrist member, and/or the drive assembly for the second wrist member in a series of steps that enables swapping the substrates without crossing one wafer over another and/or one arm over a wafer. To accomplish this, the first wrist member and/or the second wrist member may rotate 360 degrees or more within the transfer chamber to swap the substrates.

At block 1206, the method further includes controlling tension of at least one belt of a multi-turn drive assembly by transmitting a signal from the controller to the robot to operate at least one tensioner element that increases, maintains and/or decreases tension on the belt. As discussed above, in multi-turn drive assemblies as described herein, each band wraps on itself, for example, at least twice, around a driving member and a driven member in some positions. As a band unwinds, the band may lose tension as a result of changes in the outer radius and/or outer diameter of the driving member and/or driven member. The tensioner element is configured to pull and/or release an end of the band to increase or decrease tension in the band, respectively, as may be called for. If not called for, the tensioner element is also configured to remain idle. If each end of each band is attached to the driving member and the driven member via a tensioner element (i.e., two tensioner elements per band), then each of these tensioner elements may operate simultaneously to maintain a predetermined tension (e.g., about 135 Hz±10 Hz at a tensile load of about 450 N to about 650 N for a belt having a thickness of about 10 mils) in each band.

The method 1200 can further include at block 1208, controlling phasing between the driving member and the driven member of a multi-turn drive assembly. For example, if the multi-turn drive assembly is configured to rotate a first wrist member of a robot about a wrist axis, the controller will control the degree of rotation of each of the driving member using the non-linear transmission ratio. In embodiments where a size (i.e., diameter) ratio of the driving member to the driven member is greater than 1:1, the rotational position of the driving member with respect to the rotational position of the driven member will be non-linear. For a 2:1 ratio, every half turn (i.e., 180 degree rotation) of the driving member will equate to a full turn (i.e., a 360 degree) of the driven member. The controller is configured to operate the control algorithm to track the rotational positions of the driving member and the driven member and to simultaneously adjust the tension of the bands. In this way, the controller provides precise operation of any link members including a multi-turn drive assembly as described herein.

A controller that controls the robot arm having the drive assembly with a multi-turn band transmission may be and/or include a computing device such as a personal computer, a server computer, a programmable logic controller (PLC), a microcontroller, and so on. The controller may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller may include a data storage device (e.g., one or more disk drives and/or solid state drives), a main memory, a static memory, a network interface, and/or other components. The controller may execute instructions to perform any one or more of the methodologies and/or embodiments described herein, such as operations of method 400. The instructions may be stored on a computer readable storage medium, which may include the main memory, static memory, secondary storage and/or processing device (during execution of the instructions). The controller may also be configured to permit entry and display of data, operating commands, and the like by a human operator.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method for controlling a multi-turn drive assembly of a robot, the robot comprising:
    an arm rotatable about a shoulder axis;
    a forearm rotatable relative to the arm about a forearm axis at a position offset from the shoulder axis; and
    a forearm drive assembly for rotating the forearm about the forearm axis, the forearm drive assembly comprising:
        a forearm driving member comprising a first plurality of machined sections around the center point and circumference of the forearm driving member, each of the first plurality of machined sections having a different radius;
        a forearm driven member attached to the forearm, the forearm driven member comprising a second plurality of machined sections around the center point circumference of the forearm driven member, each of the second plurality of machined sections having a different radius;
        a forearm transmission element comprising:
            a first band, wherein a first end of the first band is affixed to the forearm driving member and a second end of the first band is affixed to the forearm driven member, and wherein the first band wraps at least two times around the forearm driving member when the forearm is in a first forearm position; and
            a second band, wherein a first end of the second band is affixed to the forearm driving member and a second end of the second band is affixed to the forearm driven member, wherein the second band wraps at least two times around the forearm driven member when the forearm is in the first position,
            wherein the first band is wrapped around the forearm driving member in a first direction and the second band is wrapped around the forearm driving member in an opposite second direction,
    the method comprising:
        controlling the forearm drive assembly to rotate the forearm about the forearm axis by at least 360 degrees; and
        controlling tension of at least one of the first band or the second band.

2. The method of claim 1, wherein controlling tension comprises transmitting a signal from a controller to the robot to operate at least one tensioner element configured to control tension of the first band or the second band.

3. The method of claim 1, wherein controlling tension comprises increasing, maintaining or decreasing tension on at least one of the first band or the second band.

4. The method of claim 1, wherein controlling tension comprises pulling or releasing by one or more tensioner elements at least one of a first end of the first band or a first end of the second band to increase or decrease tension.

5. The method of claim 1, wherein controlling tension comprises at least one of:
    pulling or releasing a first end of the first band by a first tensioner element and a second end of the first band by a second tensioner element to increase or decrease tension in the first band; or
    pulling or releasing a first end of the second band by a third tensioner element and a second end of the first band by a fourth tensioner element to increase or decrease tension in the second band.

6. The method of claim 5, wherein at least one of:
    the first and second tensioner elements operate together at about 125 Hz to about 145 Hz to maintain a predetermined tension of the first band about 450 N to about 650 N, wherein the first band has a thickness of about 10 mils, or
    the third and fourth tensioner elements operate together at about 125 Hz to about 145 Hz to maintain a predetermined tension of the second band at about 450 N to about 650 N, wherein the second band has a thickness of about 10 mils.

7. The method of claim 1, further comprising controlling phasing between the forearm driving member and the forearm driven member.

8. The method of claim 7, wherein controlling phasing comprises controlling a degree of rotation of the forearm driving member using a non-linear transmission ratio.

9. The method of claim 8, wherein controlling the degree of rotation comprises tracking rotational positions of the forearm driving member and the forearm driven member and adjusting tension of at least one of the first band or the second band.

10. A method for controlling a multi-turn drive assembly of a robot, the robot comprising:
an arm rotatable about a shoulder axis;
a forearm rotatable relative to the arm about a forearm axis at a position offset from the shoulder axis;
a first wrist member rotatable relative to the forearm about a wrist axis at a position offset from the shoulder axis; and
a first wrist drive assembly for rotating the first wrist member about the wrist axis, the first wrist drive assembly comprising:
a first wrist driving member comprising a first plurality of machined sections around the center point and circumference of the first wrist driving member, each of the first plurality of machined sections having a different radius;
a first wrist driven member attached to the forearm, the first wrist driven member comprising a second plurality of machined sections around the center point and circumference of the first wrist driven member, each of the second plurality of machined sections having a different radius, wherein the first wrist driven member is attached to the first wrist driving member by a torsion spring; and
a first wrist transmission element, comprising:
a first band, wherein a first end of the first band is affixed to the first wrist driving member and a second end of the first band is affixed to the first wrist driven member, and wherein the first band wraps at least two times around the first wrist driving member when the first wrist member is in a first wrist position; and
a second band, wherein a first end of the second band is affixed to the first wrist driving member and a second end of the second band is affixed to the first wrist driven member, wherein the second band wraps at least two times around the first wrist driven member when the first wrist member is in the first position,
wherein the first band is wrapped around the first wrist driving member in a first direction and the second band is wrapped around the first wrist driving member in an opposite second direction,
the method comprising:
controlling the first wrist drive assembly to rotate the first wrist member about the first wrist axis by at least 360 degrees; and
controlling tension of at least one of the first band or the second band.

11. The method of claim 10, wherein controlling tension comprises transmitting a signal from a controller to the robot to operate at least one tensioner element configured to control tension of the first band or the second band of the first wrist transmission element.

12. The method of claim 10, wherein controlling tension comprises increasing, maintaining or decreasing tension on at least one of the first band or the second band of the first wrist transmission element.

13. The method of claim 10, wherein controlling tension comprises pulling or releasing by one or more tensioner elements at least one of a first end of the first band of the first wrist transmission element or a first end of the second band of the first wrist transmission element to increase or decrease tension.

14. The method of claim 10, wherein controlling tension comprises at least one of:
pulling or releasing a first end of the first band of the first wrist transmission element by a first tensioner element and a second end of the first band of the first wrist transmission element by a second tensioner element to increase or decrease tension in the first band; or
pulling or releasing a first end of the second band of the first wrist transmission element by a third tensioner element and a second end of the second band of the first wrist transmission element by a fourth tensioner element to increase or decrease tension in the second band.

15. The method of claim 14, wherein at least one of:
the first and second tensioner elements operate together at about 125 Hz to about 145 Hz to maintain a predetermined tension of the first band about 450 N to about 650 N, wherein the first band has a thickness of about 10 mils, or
the third and fourth tensioner elements operate together at about 125 Hz to about 145 Hz to maintain a predetermined tension of the second band at about 450 N to about 650 N, wherein the second band has a thickness of about 10 mils.

16. The method of claim 10, further comprising controlling phasing between the first wrist driving member and the first wrist driven member.

17. The method of claim 16, wherein controlling phasing comprises controlling a degree of rotation of the first wrist driving member using a non-linear transmission ratio.

18. The method of claim 17, wherein controlling the degree of rotation comprises tracking rotational positions of the first wrist driving member and the first wrist driven member and adjusting tension of at least one of the first band or the second band.

19. The method of claim 10, wherein controlling the first wrist member drive assembly comprises:
receiving by the controller a first signal from a process chamber indicating that the process chamber has finished processing a first substrate;
sending by the controller a second signal to the robot to remove the first substrate from the process chamber and removing, by the robot, the first substrate from the process chamber, wherein removing by the robot the first substrate comprises activating the first wrist member drive assembly to swap the first and second substrates without crossing the first substrate over the second substrate; and
placing by the robot a second substrate in the process chamber.

20. The method of claim 10, wherein the robot further comprises:
a second wrist member rotatable relative to the forearm about the wrist axis, wherein the second wrist member has a wrist joint rotation of at least 360 degrees about the wrist axis; and a second wrist drive assembly for rotating the second wrist member about the wrist axis, the second wrist drive assembly comprising:
- a second wrist driving member comprising a first plurality of machined sections around the center point and circumference of the second wrist driving member, each of the first plurality of machined sections having a different radius;
- a second wrist driven member attached to the forearm, second wrist driven member comprising a second plurality of machined sections around the center point and circumference of the second wrist driven member, each of the second plurality of machined sections having a different radius; and
- a second wrist transmission element, comprising:
  - a first band, wherein a first end of the first band is affixed to the second wrist driving member and a second end of the first band is affixed to the second wrist driven member, and wherein the first band wraps at least two times around the second wrist driving member when the second wrist member is in a first wrist position; and
  - a second band, wherein a first end of the second band is affixed to the second wrist driving member and a second end of the second band is affixed to the second wrist driven member, wherein the second band wraps at least two times around the second wrist driven member when the second wrist member is in the first position,
  - wherein the first band is wrapped around the second wrist driving member in a first direction and the second band is wrapped around the second wrist driving member in an opposite second direction;

the method further comprising:
- controlling the second wrist drive assembly to rotate the second wrist member about the second wrist axis by at least 360 degrees; and
- controlling tension of at least one of the first band or the second band of the second wrist transmission element.

* * * * *